United States Patent [19]

Shiomi et al.

[11] Patent Number: 5,124,589
[45] Date of Patent: Jun. 23, 1992

[54] SEMICONDUCTOR INTEGRATED CIRCUIT CAPABLE OF SYNCHRONOUS AND ASYNCHRONOUS OPERATIONS AND OPERATING METHOD THEREFOR

[75] Inventors: Toru Shiomi; Shigeki Ohbayashi; Atsushi Ohba, all of Hyogo, Japan

[73] Assignee: Mitsubishi Denki Kabushiki Kabushiki Kaisha, Tokyo, Japan

[21] Appl. No.: 691,615

[22] Filed: Apr. 25, 1991

[30] Foreign Application Priority Data

Jun. 19, 1990 [JP] Japan ................................ 2-160847

[51] Int. Cl.$^5$ ......................................... H03K 19/092
[52] U.S. Cl. ................................ 307/465; 307/272.2;
  307/475; 307/480; 365/189.05; 371/21.1
[58] Field of Search ............... 307/455, 480, 465–467,
  307/475, 272.2; 365/189.05, 230.05; 371/21.1

[56] References Cited

U.S. PATENT DOCUMENTS

| | | | |
|---|---|---|---|
| 4,694,197 | 9/1987 | Sprague | 307/480 X |
| 4,756,006 | 7/1988 | Rickard | 307/480 X |
| 4,761,567 | 8/1988 | Walters, Jr. et al. | 307/475 X |
| 4,766,572 | 8/1988 | Kobayashi | 365/189.05 |
| 4,812,678 | 3/1989 | Abe | 307/465 X |
| 4,825,414 | 4/1989 | Kawata | 365/189.05 |
| 4,857,773 | 8/1989 | Takata et al. | 307/465 |
| 4,942,318 | 7/1990 | Kawana | 307/465 |
| 4,972,518 | 11/1990 | Matsuo | 307/480 |
| 5,003,204 | 3/1991 | Cushing et al. | 307/465 |
| 5,017,813 | 5/1991 | Galbraith et al. | 307/465 X |

FOREIGN PATENT DOCUMENTS

| | | | |
|---|---|---|---|
| 0161639 | 11/1985 | European Pat. Off. | 371/21.1 |
| 1-184798 | 7/1989 | Japan . | |

*Primary Examiner*—David Hudspeth
*Attorney, Agent, or Firm*—Lowe, Price, LeBlanc & Becker

[57] ABSTRACT

A self-timed random-access memory device includes randomly accessible memory circuitry (7), a clock generator (9) responsive to an external clock signal for generating an internal clock signal, an input circuit (8') responsive to the internal clock signal for latching and outputting a supplied input signal, an output circuit (11') responsive to the internal clock signal for latching and outputting an output from the memory device, and circuitry (81, 82, 85, 86; 115, 116, 124, 125; 135, 136, 144, 145) responsive to a through state specifying signal (TH, THM) for disabling the latch function of the input circuit and the output circuit. The memory device can be switched, in response to the through state specifying signal, between a mode operating synchronously with the externally supplied clock signal and another mode operating asynchronously with the externally supplied clock signal.

24 Claims, 20 Drawing Sheets

SEMICONDUCTOR INTEGRATED CIRCUIT CAPABLE OF SYNCHRONOUS AND ASYNCHRONOUS OPERATIONS AND OPERATING METHOD THEREFOR

BACKGROUND OF THE INVENTION

1. Field of the Invention

The present invention generally relates to a semiconductor integrated circuit operable in synchronous mode, and specifically to a synchronous semiconductor integrated circuit including an ECL (Emitter Coupled Logic) circuit as its component and performing inputting and outputting of signals using a clock signal as a synchronizing signal.

More particularly, the present invention relates to a synchronous semiconductor integrated circuit including a bipolar RA (Random Access Memory) or a BiCMOS RAM as its internal circuit.

2. Description of the Related Art

Various types of memories have been developed and put into practice using semiconductor circuit integration technics. Among these memories, there is a high-speed memory referred to as ECL RAM. The ECL RAM includes a pair of emitter-coupled bipolar transistors as its basic memory cell and operates at ECL levels. The ECL RAM usually uses 0 V, or ground potential, as its first power source potential $V_{CC}$ and uses a negative potential of $-4.5$ V or $-5.2$ V as its second power source potential $V_{EE}$. Of the ECL levels, the high level ("H") is about $-0.9$ V and the low level ("L") is about $-1.7$ V.

FIG. 1 is a diagram schematically showing an overall arrangement of a conventional semiconductor memory comprising, for example, an ECL RAM. Referring to FIG. 1, the semiconductor memory 7 includes a memory cell array 4 with memory cells arranged in a matrix of rows and columns. The memory cell array 4 includes a plurality of word lines arranged along the rows and a plurality of bit lines arranged along columns. A column of an ECL RAM in general is made of a pair of bit lines and one memory cell is located at each intersection of the pairs of bit lines and word lines.

In order to select a desired memory cell from the memory cell array 4, there are provided an X address buffer decoder 2 and a Y address buffer decoder 3. The X address buffer decoder 2 buffers an X address externally supplied thereto, generates an internal row address and decodes the internal row address, thereby selecting a corresponding word line from the memory cell array 4. The Y address buffer decoder 3 buffers a Y address externally supplied thereto, generates an internal column address and decodes the internal column address, thereby selecting a column (a pair of bit lines) when the memory is of "x 1 bit" arrangement.

The semiconductor memory further includes an R/W control circuit 1, a sense amplifier 5, and a data output buffer 6. The R/W control circuit 1 is supplied with a chip-select signal $\overline{CS}$, a write enable signal $\overline{WE}$, and input data Din, and in data writing, it writes the data corresponding to the input data Din into a selected memory cell of the memory cell array 4 while disabling the sense amplifier 5. The R/W control circuit 1 also controls the operation of the data output buffer 6 in response to the chip-select signal $\overline{CS}$ and write-enable signal $\overline{WE}$.

The sense amplifier 5 senses and amplifies the data in a memory cell selected from the memory cell array 4 and transmits the data to the data output buffer 6. The data output buffer 6, controlled by a control signal from the R/W control circuit 1, provides output data Dout corresponding to the signal transmitted from the sense amplifier 5. The operation will be briefly described below.

When the chip-select signal $\overline{CS}$ is in an inactivation state at "H", the R/W control circuit 1 and data output buffer 6 are put into a disable state, where writing and reading of data are inhibited. At this time, the output data Dout delivered from the data output buffer 6 is brought to a predetermined level, for example, at "L", or a high impedance state.

When the chip-select signal $\overline{CS}$ is turned into an activation state at "L", the X address buffer decoder 2 and the Y address buffer decoder 3, respectively, accept and decode external X address and Y address and generate a row select signal and a column select signal. The memory cell at the intersection of the row and column designated by the row and column select signals is selected.

When the write-enable signal $\overline{WE}$ is at "H" level, a data-read mode is designated. At this time, the R/W control circuit 1 puts the sense amplifier 5 and data output buffer 6 into an activated state. The activated sense amplifier 5 senses and amplifies the data in the selected memory cell and transmits the data to the data output buffer 6. The data output buffer 6 outputs the output data Dout corresponding to the transmitted data from the sense amplifier 5.

When the write-enable signal $\overline{WE}$ is at "L", a data-write mode is designated. At this time, the R/W control circuit 1 put the sense amplifier 5 into an inactivated state and at the same time put the data output buffer 6 into an output disable state, thereby setting its output data Dout to a fixed level.

Meanwhile, the R/W control circuit 1, responding to the signals $\overline{CS}$ and $\overline{WE}$, generates internal data from the input signal Din and write the internal data into the selected memory cell. The internal data is generated from the externally supplied input signal Din when the writeenable signal $\overline{WE}$ is brought to the activation state at "L".

Writing and sensing of data in the ECL RAM are performed according to a current value of the current flowing through the selected column (pair of bit lines). The R/W control circuit 1 applies a signal corresponding to the input signal Din to the bases of the bipolar transistors for writing provided for each bit line, whereby a change of the current corresponding to the input data is produced in the selected column and writing of the data into the memory cell is achieved.

The semiconductor memory of the above described ECL RAM or the like is frequently used in combination with a logic circuit. In such a case, to achieve high-speed and accurate data inputting and outputting, it is preferred to synchronize the logical operation of the logic circuit with write/read operation in the semiconductor memory. In consideration of such situation, a synchronous RAM, i.e., a self-timed RAM (hereinafter briefly called "STRAM"), in which input and output of signals are controlled according to a clock signal used as a synchronizing signal is developed.

FIG. 2 is a block diagram schematically showing the basic circuit configuration of such STRAM. Referring to FIG. 2, the STRAM is integrated on a chip 900, and it includes a standard RAM circuit block 7 having the same structure as that of the RAM shown in FIG. 1, and it also includes an input data retaining circuit 8, a clock signal generator 9, a write pulse generating circuit 10 and an output data retaining circuit 11, for performing data inputting to and data outputting from the standard RAM circuit block 7.

The clock generator 9 buffers an externally supplied clock signal (for example, system clock) CLK and generates an internal clock signal.

The input data retaining circuit 8 receives the clock signal from the clock generator 9 at its clock input CLOCK, latches input signals (address ADD, input data Din, chip-select signal $\overline{CS}$, and write-enable signal $\overline{WE}$) supplied to its input terminal D, and outputs these signals from its output terminal Q in response to the clock signal.

The write pulse generating circuit 10 generates a write pulse for controlling data writing in response to the internal clock signal from the clock generator 9 and the internal control signals (generated in response to the signals $\overline{CS}$ and $\overline{WE}$) from the input data retaining circuit 8. The write pulse is a pulse signal having the pulse width corresponding to the period that the write-enable signal $\overline{WE}$ is held in an activation state in the RAM shown in FIG. 1.

The output data retaining circuit 11 receives the internal clock signal from the clock generator 9 at its clock input CLOCK, latches the data from the standard RAM circuit block 7 received at its input terminal D outputs the output data Dout from its output terminal Q in response to the internal clock signal.

The STRAM shown in FIG. 2 differs from the standard RAM shown in FIG. 1 in that its write operation is not started by the signals $\overline{CS}$ and $\overline{WE}$, but started by the clock signal CLK and that the write pulse is generated by the write pulse generating circuit 10 within the chip 900.

FIG. 3 is a block diagram showing in more detail the circuit configuration of the STRAM shown in FIG. 2.

Referring to FIG. 3, the input data retaining circuit 8 includes a retaining circuit 8a which latches and outputs an externally applied address signal ADD (which includes both X address and Y address), a retaining circuit 8b which latches and outputs an externally applied input signal Din, a retaining circuit 8c which latches and outputs the externally applied write-enable signal $\overline{WE}$, and a retaining circuit 8d which latches and outputs the externally applied chip select signal $\overline{CS}$.

Each of the retaining circuits 8a to 8d is formed of a master-slave register which is triggered at an edge of the internal clock signal. More specifically, the retaining circuit 8a is formed of a master circuit 14a and a slave circuit 15a which receives Q output from the master circuit 14a. The retaining circuit 8b includes a master circuit 14b and a slave circuit 15b which receives Q output from the master circuit 14b. The retaining circuit 8c includes a master circuit 14c and a slave circuit 15c. The retaining circuit 8d includes a master circuit 14d and a slave circuit 15d.

Each of the master circuits 14a to 14d latches a signal applied to the D input at the leading edge of the internal clock signal from the clock generator 9. Each of the slave circuits 15a to 15d latches the signal supplied from its corresponding master circuit at the trailing edge of the internal clock signal.

The write pulse generating circuit 10 is driven by the clock signal from the clock signal generator 9 and generates, at predetermined timings in response to the signals (corresponding to the signals $\overline{WE}$ and $\overline{CS}$ from the retaining circuits 8c and 8d), various pulse signals necessary for data writing, which pulse signals control the operations of the sense amplifier and R/W control circuit 1 included in the standard RAM circuit block 7.

The output data retaining circuit 11 is formed of a master-slave register similarly to the input data retaining circuit 8, and includes a master circuit 79 which latches the signal applied to its D input in response to the rising of the internal clock signal from the clock generator 9, and a slave circuit 80 which latches the Q output of the master circuit 79 in response to the falling of the internal clock signal from the clock generator 9. The output from the output data retaining circuit 11 is supplied to an output buffer 13. The output buffer 13, in response to an output from the output data retaining circuit 11, drives an output signal line at a high speed and outputs an output data Dout.

The STRAM further includes a multiplex circuit 12. The standard RAM 7 shown in FIG. 1 controls the output state of the data output buffer 6 by means of the R/W control circuit 1. In the STRAM, however, an read out data signal is transmitted to the output buffer circuit 13 through the output data retaining circuit 11 performing a clocked operation. In this way, the operation of the output buffer circuit 13 is not controlled by an R/W control circuit, and the output state of the output buffer circuit 13 is essentially controlled by the multiplex circuit 12.

The multiplex circuit 12, depending on the operating mode of the STRAM, selectively supplies either of the output data from the standard RAM circuit block 7 and data generated from the signals transmitted from the input data retaining circuits 8c and 8d to the output data retaining circuit 11.

In the data-write operation (when both the signals $\overline{CS}$ and $\overline{WE}$ are in the activation state) and at the chip-unselect period (when the signal $\overline{CS}$ is in the inactivation state), the multiplex circuit 12 supplies a signal at a fixed level of, for example, "L", to the output data retaining circuit 11. When the signal $\overline{WE}$ is in the inactivation state and the signal $\overline{CS}$ is in the activation state whereby the data-read operation is indicated, the multiplex circuit 12 transmits the signal sensed and amplified by the sense amplifier of the standard RAM circuit block 7 to the output data retaining circuit 11.

The register type STRAM shown in FIG. 3 has master-slave registers triggered by the edges of the internal clock signal as its signal input and output circuits and, although a read out data is output with a delay of one clock cycle, it has such an advantage that its cycle time can be made essentially shorter than that in the standard RAM because valid data is output in response to the rising of the clock signal. The data-read operation will be described below with reference to FIG. 4

The master circuits 14a to 14d and 79 are brought into a latch state when the clock signal CLK is at "H" and into a through state when the clock signal CLK is at "L". The slave circuits 15a to 15d and 80 are brought into the through state when the clock signal CLK is at "H" and into the latch state when the clock signal CLK is at "L". Here, the latch state means a state that a circuit continuously retains a latched signal and outputs the signal regardless of the kind of the input signal. The through state means a state that a circuit allows an applied input signal to unchangedly pass therethrough. Signals latched by the master circuits 14a to 14d and 79 are the input signals which have already been provided thereto before the clock signal CLK rises to "H". The signals latched by the slave circuits 15a to 15d and 80 are the signals which have already been given thereto before the clock signal CLK falls to "L".

In the data-read operation, the chip-select signal $\overline{CS}$ is set to "L" and the write-enable signal $\overline{WE}$ is set to "H". An external address ADD is set to the values designating a desired memory cell. When a time ts elapsed after signals $\overline{CS}$, $\overline{WE}$, and ADD were settled, the clock signal CLK rises to "H". Here, the time $t_s$ is called a setup time and each signal must be in the settled state when this time has passed. The signals $\overline{CS}$, $\overline{WE}$, and ADD are required to be held unchanged at least for a period $t_H$ after the rise to "H" of the clock signal CLK. The period $t_H$ is called a hold time. Throughout the periods of the setup time $t_S$ and the hold time $t_S$, each signal $\overline{CS}$, $\overline{WE}$, and ADD remains in the settled state.

With the rise to "H" of the clock signal CLK, the internal clock signal from the clock generator 9 also rises to "H". The master circuits 14a to 14d and 79 are thereby brought into the latch state. At this time, since the signals $\overline{WE}$, $\overline{CE}$, and ADD are already settled in specific states, the signals latched by the master 14a to 14d and 79 are the signals which have already been given thereto before the clock signals CLK rises to "H".

On the other hand, in response to the rise to "H" of the clock signal CLK, the slave circuits 15a to 15d and 80 are brought into the through state. Therefore in response to the rise to "H" of the clock signal CLK, the signals which have been given are transmitted through the slave circuits to their associated circuits.

When the clock signal CLK falls to "L", the slave circuits 15a and 15d and 80 are brought into latch state and the master circuits 14a to 14d are brought into the through state. With the fall to "L" of the clock signal CLK, the addresses transmitted to the X decoder and Y decoder are brought into their settled state, whereby the selected row and selected column are made definite and a corresponding memory cell is selected from the memory cell array.

The write pulse generating circuit 10 generates a one-shot pulse signal in response to the rise of the internal clock signal and supplies a control signal obtained through the logical product of this one-shot pulse signal and the signal $\overline{WE}$ to the R/W control circuit of the block 7 as the write pulse. In response to this control signal from the write pulse generating circuit 10, the R/W control circuit within the standard RAM circuit block 7 is operated to activate the sense amplifier and, at the same time, ignore an input data from the input data retaining circuit 8. By the activated sense amplifier, the data in the memory cell selected by the X decoder and Y decoder is sensed and amplified to be applied to the multiplex circuit 12. The multiplex circuit 12, since the signals from the input data retaining circuits 8c and 8d are indicating the data-read mode, allows the data from the standard RAM circuit block 7 to pass therethrough.

When the data-read operations are successively performed as shown in FIG. 4, the states of the input data retaining circuits 8c and 8d are set so as to continuously indicate the data-read mode, and during these periods, the multiplex circuit 12 successively transmits the output data from the sense amplifier of the standard RAM circuit block 7 to the output data retaining circuit 11. Therefore, at the end of the periods $\text{Ⓐ}$ and $\text{Ⓑ}$ indicated in FIG. 4, the data from a selected memory cell is delivered at the input of the output data retaining circuit 11. At this time, since the master circuit 79 of the output data retaining circuit 11 is in the latch state, the data read out during the preceding cycle is output through the output buffer circuit 13.

Then, upon rising to "H" of the clock signal CLK once again, the master circuits 14a to 14d and 79 are brought to the latch state and the slave circuits 15a to 15d and 80 are brought into the through state, and the above described operations are repeated. As a result, the data read out in the preceding cycle is output as the output data Dout through the master circuit 79 and the slave circuit 80 of the output data retaining circuit 11, and the output buffer circuit 13. The new output data Dout is output with a delay time $t_{DR}$ after the rise of the clock signal CLK, the delay time being provided by the output data retaining circuit 11 and the output buffer circuit 13. The delay time $t_{DR}$ is shorter than the pulse width CLK.PWH of the clock signal CLK (the period that the clock signal CLK is at "H"), so that a settled output data Dout is output before the slave circuit 80 of the output data retaining circuit 11 is brought to the latch state.

As described in the foregoing, although memory cell data Qn corresponding to the address An given at the timing of the rise of the clock signal CLK is output during the following clock cycle, there is no address access time (the time required from application of an address signal to appearance of the output data in a settled state) as is present in the standard RAM shown in FIG. 1. Since the output data reaches a settled state with only the delay time $t_{DR}$ after the rise of the clock signal through the output slave circuit 80 and the output buffer circuit 13, one cycle time $t_{CYC}$ (READ) can be shortened and high speed data reading can be achieved.

In the data-read cycle, at the timing of the rise to "H" of the clock signal CLK, the chip-select signal $\overline{CS}$ is set to "L" and the write-enable signal $\overline{WE}$ is set to "L" and further, an address ADD is settled, and the input data Din to the input data retaining circuit 8b is settled. In this data-write cycle, selection of a memory cell by the X decoder and Y decoder is performed similarly as in the data-read cycle. At this time, the write pulse generating circuit 10 receives signals from the input data retaining circuits 15c and 15d in response to the rise of the clock signal from the clock generator 9 and generates a control signal (write pulse) necessary for data writing at a predetermined timing. Thereupon, the R/W control circuit accepts an input data Din and transmits the data to a selected memory cell, while it brings the sense amplifier into an inactivated state.

On the other hand, the multiplex circuit 12, in response to the state of the signals from the input data retaining circuits 8c and 8d indicating the data-write mode, ignores the output data from the standard RAM circuit block 7 and continuously transmits a signal at a predetermined level (for example, "L" level) produced from these signals to the output data retaining circuit 11.

Therefore, in the write cycle, the data writing is performed within one clock cycle (the period covering the period $\text{Ⓐ}$ and the period $\text{Ⓑ}$ in FIG. 4). The data writing is also performed in synchronization with the clock signal and, hence, $\overline{CS}$- or $\overline{WE}$- access time is not required. Since it is only required that some particular signals are settled at the timing of the rise of the clock signal CLK, high-speed data writing can be achieved.

In the above case, the decoding timing by the X decoder and Y decoder is not controlled by the clock signal, and the decoding operation is performed in response to received signals, i.e., the decoding operation is performed in response to a settled address. Data writing or data reading in the standard RAM circuit block 7 is performed upon generation of a signal for setting the R/W control circuit in the data-write mode or the data-read mode, the signal being generated by the write pulse generating circuit 10 at predetermined timing in response to the rise of the clock signal CLK.

FIG. 5 is a diagram showing a specific example of a circuit configuration of the input data retaining circuits 8a to 8d shown in FIG. 3. Since the input data retaining circuits 8a to 8d all have the same circuit configuration, the input data retaining circuit 8, and the input master circuit 14 and input slave circuit 15 are representatively shown.

Referring to FIG. 5, the input data retaining circuit includes the input master circuit 14 and the input slave circuit 15 each of which is formed of an ECL circuit. The master circuit 14 and slave circuit 15 of such ECL circuit configuration have, as their operating power sources, a first power source potential Vcc 47 being, for example, ground potential and a second power source potential $V_{EE}$ 48 being usually set to $-5.2$ V or $-4.5$ V.

The master circuit 14 includes three pairs of emitter-coupled npn bipolar transistors 18/19, 26/27, and 20/28.

The npn bipolar transistor 18 has its base supplied with an input signal IN and its collector connected with the first power source potential 47 through a resistor 16. The npn bipolar transistor 19 has its base supplied with a reference potential $V_{BB}$ and its collector connected with the first power source potential 47 through a resistor 17.

The npn bipolar transistor 26 has its collector connected with the collector of the transistor 19 and its base connected with a constant current source 29 and also connected with the first power source potential 47 through a transistor 22 and a diode 24. The transistor 27 has its collector connected with the collector of the transistor 18 and its base connected with a constant current source 30 and also connected with the first power source potential 47 through a transistor 23 and a diode 25.

The transistor 20 has its collector connected with the emitters in common of the transistors 18/19 and its base supplied with the inverted signal NCLKB of the clock signal from the clock generator 9. The transistor 28 has its collector connected with the emitters in common of the transistors 26/27 and its base supplied with an internal clock signal CLKB from the clock generator 9. The emitters in common of the transistors 20/28 are connected with a constant current source 21.

The master circuit 14 further includes the transistors 22, 23 and the diodes 24, 25 for applying a predetermined voltage to the respective bases of the transistors 26 and 27.

The npn bipolar transistor 22 has its base connected with the collector of the transistor 18 and the collector of the transistor 27 and its collector connected with the first power source potential $V_{CC}$ 47. The diode 24 has its anode connected with the emitter of the transistor 22 and its cathode connected with the base of the transistor 26. The npn bipolar transistor 23 has its base connected with the collectors of the transistors 26 and 19 and its collector connected with the first power source potential 47. The diode 25 has its anode connected with the emitter of the transistor 23 and its cathode connected with the base of the transistor 27.

The slave circuit 15 includes pairs of emitter coupled npn bipolar transistors 33/34, 41/42, and 35/43. The transistor 33 has its collector connected with the first power source potential 47 through a resistor 31 and its base connected with the base of the transistor 27. The transistor 34 has its collector connected with the first power source potential 47 through a resistor 32 and its base connected with the base of the transistor 26.

The transistor 41 has its collector connected with the collector of the transistor 34 and the base of the transistor 38 and its base connected with the first power source potential 47 through a transistor 37 and a diode 39 and, also, connected with a constant current source 44. The transistor 42 has its collector connected with the base of the transistor 37 and the collector of the transistor 33 and its base connected with the first power source potential 47 through a transistor 38 and a diode 40 and, also, connected with a constant current source 45.

The transistor 35 has its collector connected with the emitters in common of the transistors 33/34 and its base supplied with the internal clock signal CLKB The transistor 43 has its collector connected with the common emitter of the transistors 41/42 and its base supplied with the complimentary internal clock signal NCLKB. The emitters in common of the transistors 35/43 are connected with a constant current source 36. The slave circuit 15 further includes npn bipolar transistors 37 and 38 and diodes 39 and 40. The transistor 37 has its collector connected with the collectors of the transistors 42 and 33, and its emitter connected with an output node NA. The transistor 38 has its collector connected with the first power source potential 47, its base connected with the collectors of the transistors 39 and 34, and its emitter connected with an output node A. The diode 39 has its anode connected with the output node NA and its cathode connected with the base of the transistor 41. The diode 40 has its anode connected with the output node A and its cathode connected with the base of the transistor 42.

The constant current sources 21, 29, 30, 36, 44 and 45 of the master circuit 14 and slave circuit 15 are circuits for keeping the currents at a constant value flowing therethrough into the second power source potential 48. The operation will be described below.

When the clock signal CLK rises to "H", the internal clock signal CLKB from the clock generator 9 is brought to "H" and the complementary internal clock signal NCKLB from the same is brought to "L". Hence, the transistor 20 is turned off and the transistor 28 is turned on. A current I1 flowing through the constant current source 21 is passed through the transistor 28, with no current passed through the transistor 20. Therefore, no switching operation is performed by the transistors 18 and 19. Thus, regardless of the state of the input signal IN, potentials corresponding to the collector potentials of the transistors 18 and 19 at the time of the clock signal CLKB rising to "H" are supplied to the transistors 26 and 27 through the diodes 24 and 25, respectively, so that the transistors 26 and 27 provide current flows corresponding to their base potentials.

When the input signal IN is at a higher level than the reference potential $V_{BB}$, the collector potential of the transistor 18 goes to "L" and the collector potential of the transistor 19 goes to "H". These potentials are shifted in level through the transistors 22 and 23 and the diodes 24 and 25 and transmitted to the bases of the transistors 26 and 27. Hence, the base potential of the transistor 26 goes to "L" and the base potential of the transistor 27 goes to "H". In such state, if the clock signal CLKB rises to "H", the current flowing through the resistor 16 and the transistor 18 is switched to flow through the transistor 27, and the current flowing through the resistor 17 and the transistor 19 is switched to flow the transistor 26. Therefore, the states of the transistors 23 and 22 do not change and also the base potentials of the transistors 26 and 27 do not change, so that the input signal which was applied at the time of the rise of the clock signal CLK (CLKB) is latched by the master circuit 14 and transmitted to the slave circuit 15 at the subsequent stage. This is the latch state.

When the clock signal CLK falls to "L", the clock signal CLKB is brought to "L" and the complementary clock signal NCLKB is brought to "H". In this case, the current I1 flowing through the constant current source 21 is allowed to flow through the resistors 16 and 17, the transistors 18 and 19, and the transistor 20, the values of the currents flowing through the transistors 18 and 19 reflecting the relationship between the input signal IN and the reference voltage $V_{BB}$. In such state, if the input signal changes, the base potentials of the transistors 22 and 23 are changed and, accordingly, the base potentials of the transistors 26 and 27 are also changed. Such change corresponds to the change in the input signal IN and, thus, the master circuit 14 is brought to the through state where the input signal IN is allowed to unchangedly pass therethrough.

The operation in the slave circuit 15 is quite the same as that in the master circuit 14. When the clock signal CLKB is at "H", a current I2 flowing through the constant current source 36 is allowed to flow through the resistors 31, 32, the transistors 33, 34, and the transistor 35 (the transistor 43 is in the off state), and a signal corresponding to the signal transmitted from the master circuit 14 (the base potentials of the transistors 26 and 27) is output at the output nodes A and NA.

Therefore, in the described state, the slave circuit 15 is in its through state.

On the other hand, when the clock signal CLK falls to "L", the current I2 flowing through the constant current source 36 is turned to flow through the transistors 41, 42, and 42, and the transistors 33 and 34 do not perform the switching operation. Therefore, in this state, the signal corresponding to the signal state at the time of the fall of the clock signal CLKB is continuously output from the output nodes A and NA. This state is the latch state.

Since the transistors in the ECL circuit are not operated in the saturation region but operated in the active region (nonsaturation region) and the "H" and "L" of the signals are determined by the magnitude of the currents flowing therethrough, the diodes 24, 25, 39, and 40 are provided in the circuit as the level shift means so that the transistors can be prevented from having the base-collector paths forwardly biased to be operated in the saturation region.

The constant current sources 29, 30, 44, and 45 are provided so that, even if the transistors 22, 23, 37, and 38 come to have substantially high resistance values depending on their base potentials, constant currents may be flowed against such changed resistance values and potentials corresponding to the input signal may be provided to their associated transistors 26, 27, 41, and 42.

FIG. 6 is a diagram showing an example of a specific configuration of the output data retaining circuit 11 shown in FIG. 3. The output data retaining circuit 11 has the same configuration as that of the input data retaining circuit 8 shown in FIG. 5, only differing therefrom in that the signals supplied to the input transistors 51 and 52 of the output master circuit 79 are complementary DATA and $\overline{\text{DATA}}$ from the sense amplifier in the block 7 and that the output signals from the slave circuit 80 are complementary output data AOUT and NAOUT.

Referring to FIG. 6, the output master circuit 79 includes npn bipolar transistors 51, 52, 53, 55, 56, 59, 60, and 61, resistors 49 and 50, and diodes 57 and 58. The emitter-coupled transistor 51 and 52 are supplied with the DATA and $\overline{\text{DATA}}$ at their bases, respectively.

The slave circuit 80 includes npn bipolar transistors 66, 67, 68, 70, 71, 74, 75, and 76, resistors 64 and 65, and diodes 72 and 73. The emitter-coupled transistors 66 and 67 are supplied with the output signals from the master circuit 79 at their bases. The emitter potentials of the transistors 70 and 71 are output as the output data NAOUT and AOUT.

The operation of the output data retaining circuit 11 shown in FIG. 6, is similar to that of the operation of the input data retaining circuit 8 shown in FIG. 5. When the clock signal CLK rises to "H", the complementary internal clock signal NCLKB is brought to "L", whereby a current is flowed to the constant current source 54 through the emitter-coupled transistors 59 and 60 and transistors 61, while the switching operation of the input transistors 51 and 52 is inhibited. Hence, this state is the latch state. When the clock signal CLK is brought to "L", the complementary clock signal NCLKB is brought to "H" and the current to the constant current source 54 is allowed to flow through the input transistors 51 and 52 and the transistor 53, and thus, the switching operation according to the input data to the master circuit 79 is performed. Hence, this state is the through state.

Similar operation is performed in the slave circuit 80. When the internal clock signal CLKB is at "H", the circuit is brought into the through state where it allows the output signal from the master circuit 79 to be transmitted unchangedly, and when the internal clock signal CLKB is at "L", the circuit is brought into the latch state where the data previously provided thereto is output regardless of the output of the master circuit 79.

In the course of the above described operation, the period that the external clock signal CLK is at "H" is the period Ⓐ shown in FIG. 4. Therefore, during the period Ⓐ, the input master circuit 14 and the output master circuit 79 are in the latch state and the input slave circuit 15 and the output slave circuit 80 are in the through state. On the other hand, during the period that the external clock signal CLK is at "L"(the period Ⓑ in FIG. 16), the input master circuit 14 and the output master circuit 79 are in the through state and the input slave circuit 15 and the output slave circuit 80 are in the latch state. Therefore, during the periods Ⓐ and Ⓑ in the operating waveform diagram of FIG. 4, the data supplied at the timing of the rise of the external clock signal CLK is transmitted through the multiplex circuit 12 so as to reach the input node of the output slave circuit 80 at the end of the period Ⓑ. The data as the output data is asserted when the delay period $t_{DR}$ associated with the output data retaining circuit 11 and the output buffer circuit 13 has elapsed after the start of the period Ⓒ.

Thus, the data-read cycle is started when the external clock signal CLK rises, and the data of the preceding cycle is made valid as the output at the time of this rise of the external clock signal CLK.

Conventional semiconductor integrated circuits have been structured as described above, and the address access time required for the standard RAM, in the case of the STRAM, is expressed as the sum of the clock cycle time ($t_{CYC}$ (READ) at the time of data reading) and the output delay time $t_{DR}$. Therefore, with such circuit, it is possible to perform high-speed data write-/read operations.

Generally, such semiconductor integrated circuit is subjected to functional tests to determine whether or not a product is good and capable of performing desired functions.

In such tests, it becomes necessary to measure the access time of the STRAM to determine the maximum and minimum times thereof, and set up time margins for various signals. In measuring such access time of STRAMs, the length of the access time is usually varied even if STRAMs function normally, due to voltage drops in internal signal lines, design factors, fluctuations of characteristics of devices owing to varied process parameters, and the like. When there are differences in the access time, the cycle time must be extended to measure the access time for the bit requiring a longer address access time, that is, the bit having a longer "address access time" in the standard RAM. Thus, there has been a problem that it is not possible to measure the access time of all the STRAMs with a unique clock signal cycle but the cycle time must be changed from device to device and, therefore, it is not possible to quickly measure the access times of the STRAMs.

When the cycle time is changed as described above, it follows that the operating timing of each part is changed and, such a problem arises that the operating conditions of the internal circuits (such a the standard RAM circuit block) may be changed, leading to a problem that accurate functional tests cannot be carried out.

In the stage of the standard RAM circuit blocks arranged on a wafer, measurement of their access times can be performed by means of a probe card (a testing instrument provided with wirings capable of applying desired signals to pads or nodes in a flip-chip state). After they are packaged, however, it becomes necessary to externally apply a clock signal in performing the functional test, and therefore, a problem arises that, when a malfunction is arising at the input/output circuit or the clock circuit or it is arising in the memory cells or peripheral circuitry, it makes difficult to carry out the failure analysis t locate the position of malfunction.

More specifically, the problem is that the analysis to locate the position of malfunction becomes difficult because signals can only be applied to the chip through its pin terminals once it has been packaged.

The above mentioned problems arise not only in STRAMs but also in general synchronous semiconductor circuits having input/output circuits and internal functional circuits with each of such circuits operating in synchronization with a clock signal.

A system externally monitoring a write pulse of a semiconductor memory supporting a built-in write pulse generating circuit is disclosed in Japanese Patent Laying-Open No. 1-184798. Such prior art memory device includes a write pulse generating circuit, a switching circuit responsive to an external control signal for allowing either of the external control signal and the write pulse to pass therethrough, a circuit applying an output pulse of the switching circuit to a memory array as the write pulse, and a circuit for externally monitoring the output of the switching circuit. This prior art is directed only to adjustments of the write pulse.

SUMMARY OF THE INVENTION

An object of the present invention is to eliminate the above described difficulties involved in the conventional synchronous semiconductor integrated circuits.

Another object of the present invention is to provide a synchronous semiconductor integrated circuit failure analysis of which is easily performed.

A further object of the present invention is to provide a semiconductor integrated circuit as a STRAM in which the access time can be measured without changing the cycle time even for a bit requiring a longer access time.

Yet another object of the present invention is to provide a semiconductor integrated circuit capable of operating both as a standard RAM and as a STRAM.

Another further object of the present invention is to provide an STRAM wherein it can be easily specified whether a failure is in a synchronous peripheral latch circuit or in RAM circuitry.

A still further object of the present invention is to provide an improved operating method of a synchronous semiconductor integrated circuit.

The semiconductor integrated circuit according to the present invention comprises an input data retaining circuit responsive to a clock signal for latching and outputting externally applied input signals, internal functional circuitry responsive to the signals transmitted from the input data retaining circuit for performing a predetermined functional operation, an output data retaining circuit responsive to the clock signal for latching and outputting the data output from the internal functional circuitry, and functional setting circuit means responsive to a functional mode specifying signal for disabling the latch function of the input data retaining circuit and the output data retaining circuit, thereby setting both the retaining circuits in the through state where each retaining circuit allows supplied signals to pass therethrough regardless of the state of the clock signal.

By means of the functional setting means, the input data retaining circuit means and output data retaining circuit means, in a particular functional mode, are brought into the through state. Hence, it becomes possible to measure the access time of the internal functional circuitry, for example, a STRAM, without changing the clock cycle.

Further, since the input data retaining circuit and output data retaining circuit are set in either the state performing clock-synchronized operation or, simply, the through state according to the functional mode indicating signal, when a failure is present within the semiconductor integrated circuit, it is easily detected whether the failure is in the internal functional circuitry or it is in the input data retaining circuit or output data retaining circuit. Thus, the failure analysis can be easily performed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 7:
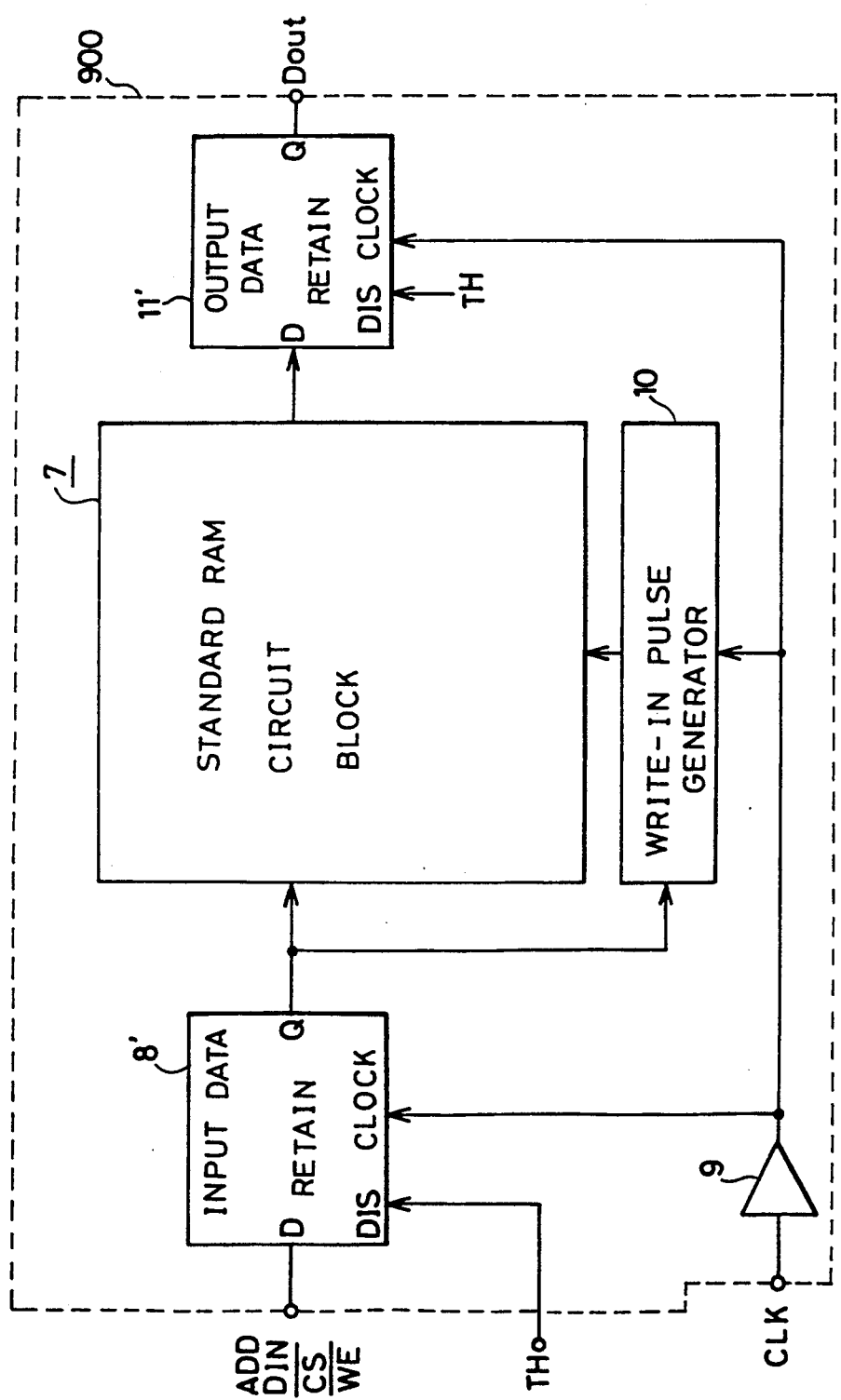
FIGS. 7 and 8 each show schematically a whole structure of the integrated circuit of the present invention.

FIG. 7 is a block diagram representing schematically a structure of a semiconductor integrated circuit according to an embodiment of the present invention.

Referring to FIG. 7, input data retain circuit 8' and output data retain circuit 11' each receive at its disable input DIS an externally applied control signal (through signal) TH. When the through signal TH is made active or at a higher level than the clock signal (CLKB, NCLKB) at the input CLOCK the latching function of the data retain circuits 8' and 11' is disabled regardless of the application of the clock signal CLK. That is, the data retain circuits 8' and 11' are set in the through state.

Figure 8:
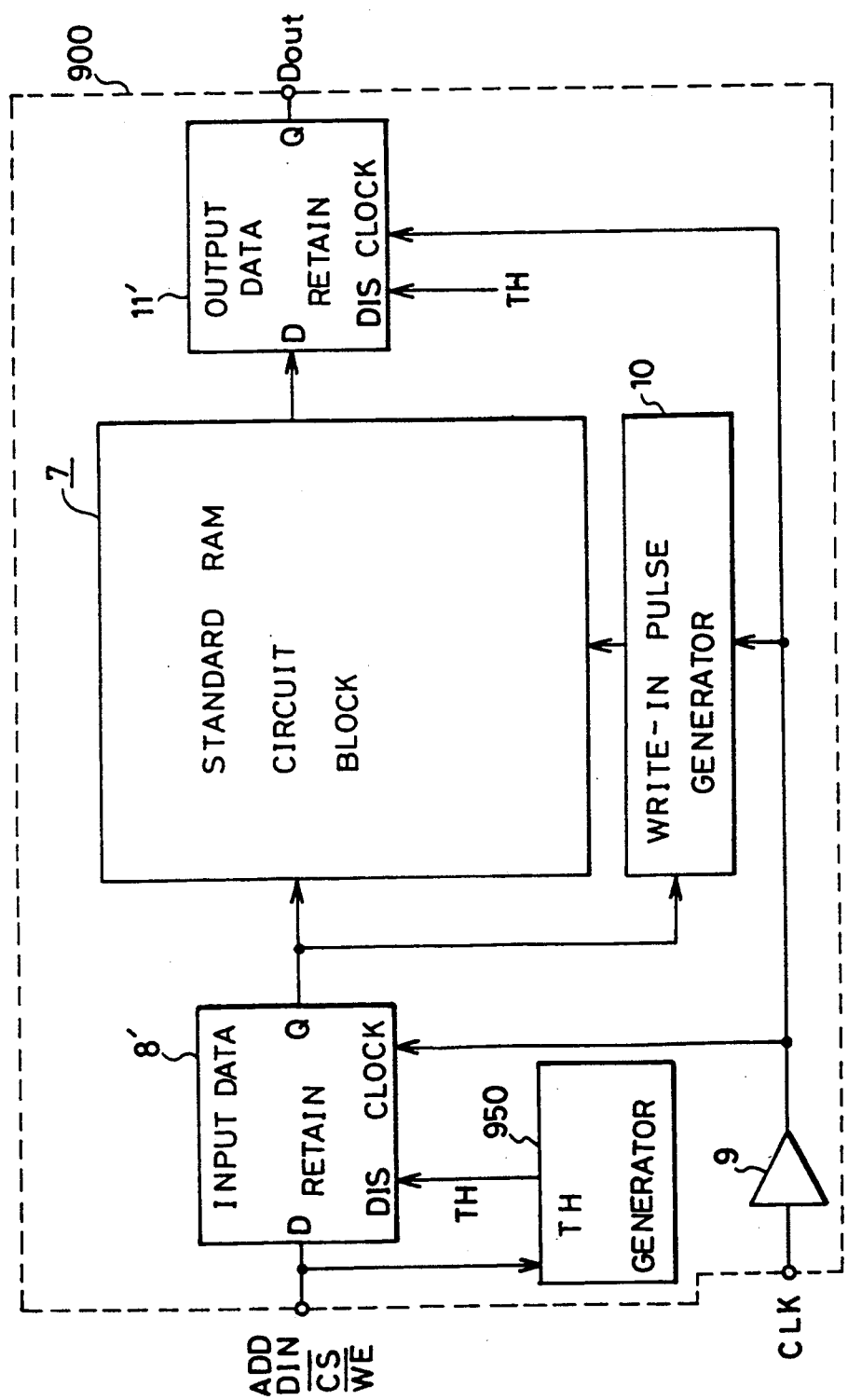

Referring to FIG. 8, there is shown another schematic structure of the semiconductor integrated circuit according to the present invention. In FIG. 8, the through signal TH is generated by a built-in TH generator 950. The TH generator 950 is activated when an external pin terminal such as $\overline{CS}$ pin, $\overline{WE}$ pin is set at a potential level different from a normal "H" or "Low" level, to generate a through signal TH for disabling the latching function of the data retaining circuits 8' and 11'.

In the structures shown in FIGS. 7 and 8, when the through signal TH is generated to be active, the semiconductor integrated circuit 900 operates as a standard RAM, or as asynchronous type circuit when the through signal TH is not generated and is set inactive, the data retain circuits 8' and 11' have their latching functions enabled, so that the integrated circuit 900 operates as an STRAM, or operates as a clock-synchronized type device.

If the integrated circuit 900 operate first as a standard RAM and then as an STRAM, under the control of the through signal TH, failure analysis can be easily accomplished. More specifically, if a failure is detected in a standard RAM operation mode, the failure is located to be in the RAM circuit block 7 or in the write-in pulse generator 10. If no failure is detected in the standard RAM operation mode and a failure is detected in the STRAM operation mode, the failure is located to be anywhere in a latching periphery circuits 8' and 11'.

In addition, specific operating characteristics of the standard RAM circuitry such as the access time can be easily measured.

Figure 5:
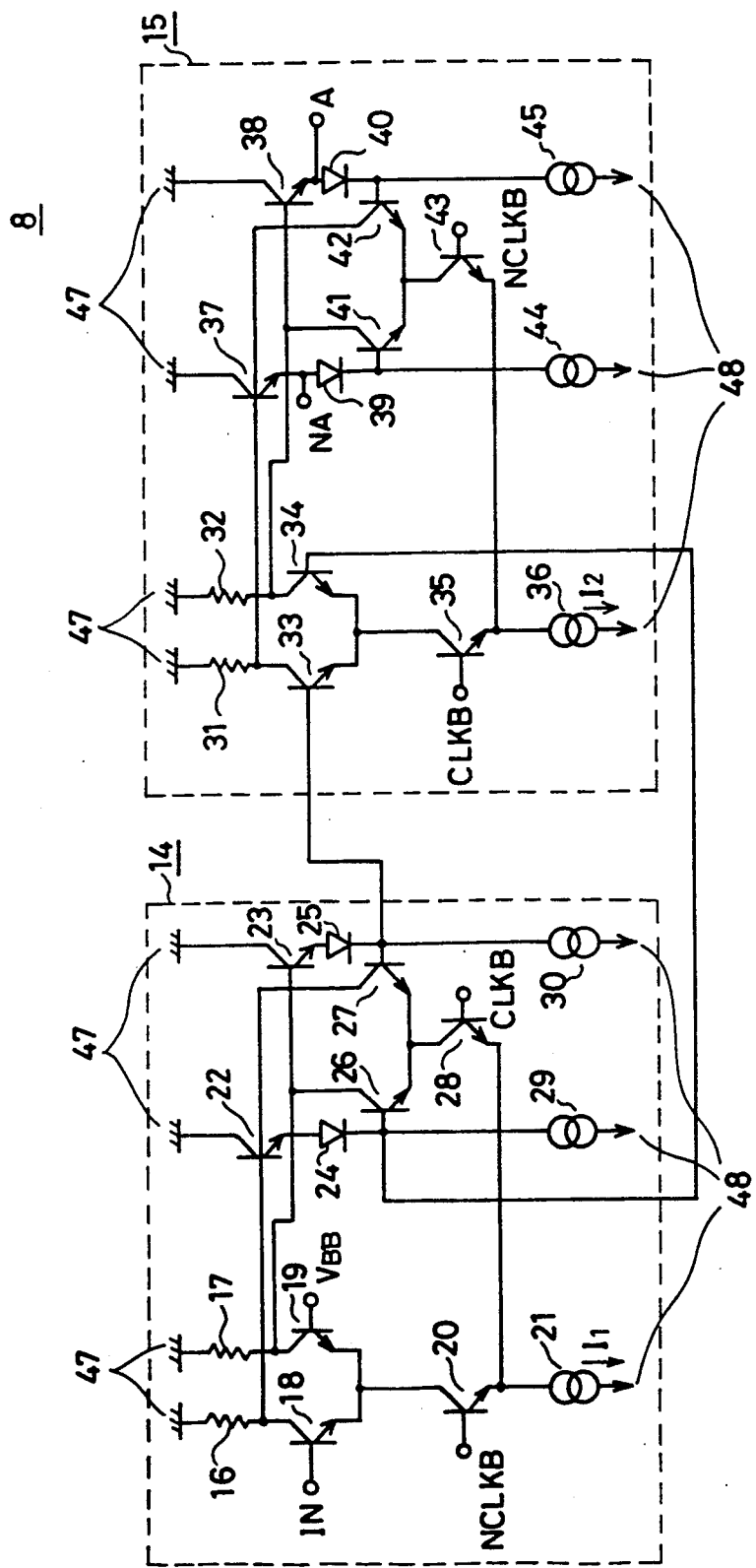
FIG. 5 is a circuit diagram showing the input data retaining circuit of the STRAM shown in FIG. 3.
Figure 9:
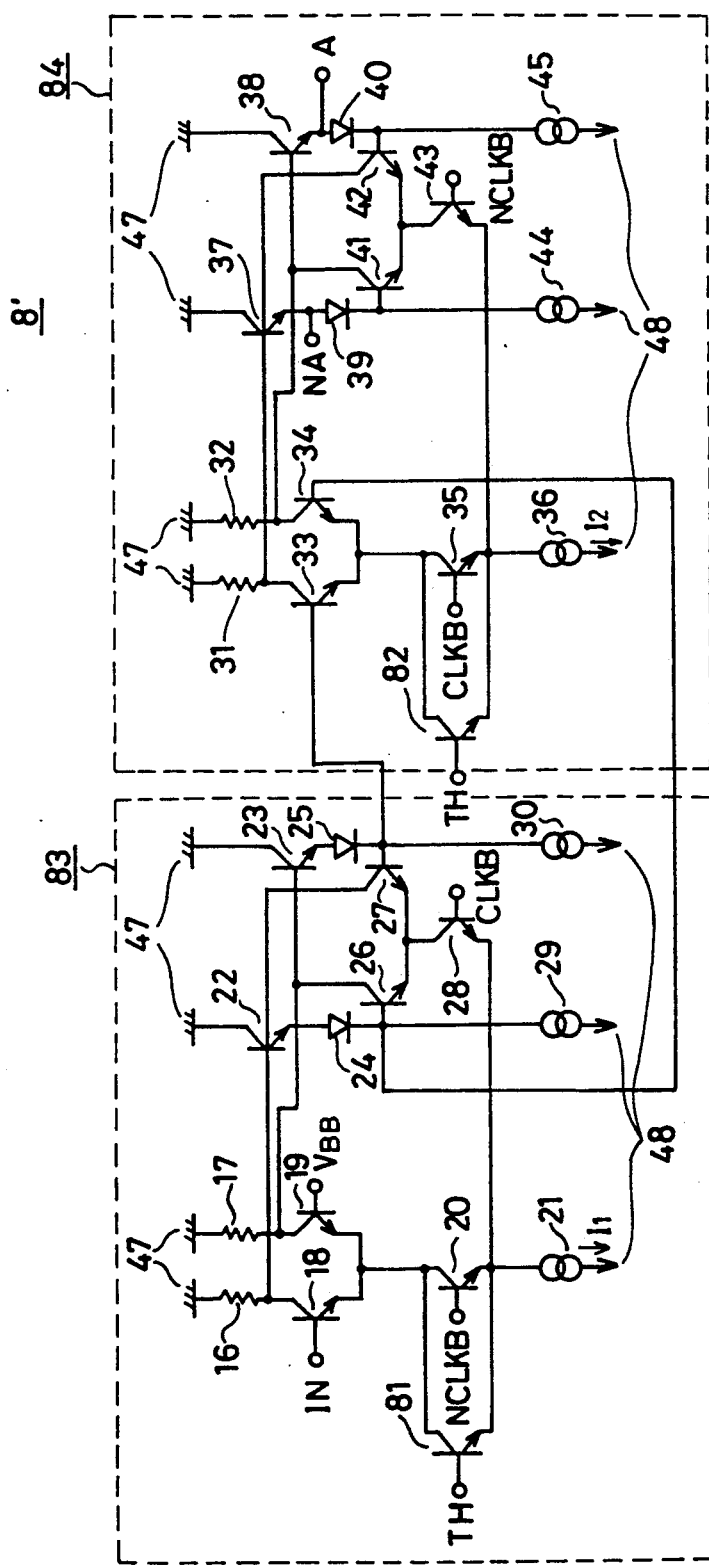
FIG. 9 is a diagram showing an example of a specific structure of an input data retaining circuit for use in a semiconductor integrated circuit according to an embodiment of the present invention.

FIG. 9 is a diagram showing a specific structure of the principal portion of a semiconductor integrated circuit according to an embodiment of the present invention and an example of structure of an input data retaining circuit is shown therein. Parts in FIG. 9 corresponding to those of the input data retaining circuit shown in FIG. 5 are denoted by like reference numerals. Referring to FIG. 7, the input data retaining circuit 8' includes an input master circuit 83 and an input slave circuit 84. The input master circuit 83 includes, in addition to the structure of the master circuit 14 shown in FIG. 5, an npn bipolar transistor 81 connected in parallel with the transistor 20 and having its base connected to receive a through signal TH. In the present arrangement, the transistor 81, 20, and 28 form an emitter-coupled circuit.

The input slave circuit 84 includes, in addition to the structure of the slave circuit 15 shown in FIG. 5, an npn bipolar transistor 82 connected in parallel with the transistor 35 and having its base connected to receive the through signal TH. In this input slave circuit 84, the transistors 35, 43, and 82 form an emitter-coupled circuit.

The through signal TH sets the operation mode of the semiconductor integrated circuit. When the internal functional circuit is a standard RAM circuit block, it sets either to a standard RAM/test mode or to a STRAM/synchronous operation mode in which the semiconductor integrated circuit device is operated in synchronization with a clock signal CLK. The operating principle will be described below. The input master circuit 83 includes an input ECL circuit formed of bipolar transistors 18/19, a latch ECL circuit formed of bipolar transistors 26/27, a mode switching ECL circuit formed of the bipolar transistors 81/20/28, and an emitter follower circuit formed of bipolar transistors 22 and 23, diodes 24 and 25, and constant current sources 24 and 25.

The input ECL circuit and the latch ECL circuit are connected in parallel. The mode switching ECL circuit is connected in series with the input ECL circuit and latch ECL circuit and provides a current flow path for either of the paths of the input ECL circuit and the latch ECL circuit.

The diodes 24 and 25 constitute level shift circuits for preventing the bipolar transistors 26 and 27 from having base-collector paths forwardly biased to operate in the saturation region. In the ECL circuits, each transistor is adapted to operate in the nonsaturation region so that its signal amplitude is kept small and its fast operation is ensured. If one of the transistors in the ECL circuit is operated in the saturation region, it will supply larger current than the current flowing through the constant current source, thereby raising its collector potential, and a problem will arise that an accurate operation becomes unachievable. The level shifting diodes 24 and 25 are therefore provided to prevent occurrence of such state due to the transistors 26 and 27 being saturated.

Likewise, the slave circuit 84 includes an input ECL circuit formed of bipolar transistors 33/34, a latch ECL circuit formed of bipolar transistors 41/42, a mode switching ECL circuit formed of the bipolar transistors 82/35/43, and an emitter follower circuit formed of bipolar transistors 37 and 38, diodes 39 and 40, and constant current sources 44 and 45. The input ECL circuit and the latch ECL circuit are connected in parallel, and the mode switching ECL circuit is connected in series with the input ECL circuit and latch ECL circuit so as to provide a current flow path for either of the input ECL circuit and the latch ECL circuit. The diodes 39 and 40 are level shift means provided for preventing the bipolar transistors 41 and 42 from being saturated.

Now, we consider the case where the through signal TH is higher than the "H" potential of the internal clock signals NCLKB, CLKB. In the input master circuit 83, the bipolar transistor 81 is turned on and the bipolar transistors 20, 28 are turned off and a current I1 flowing through the constant current circuit 21 flows from the first power source potential 47 to the second power source potential 48 ($V_{EE2}$) through the resistor 16 or 17, the bipolar transistor 18 or 19, the bipolar transistor 81, and the constant current source 21. It should be noted here that, in an ECL circuit, the maximum current flows through the transistor having the highest base potential in the emitter-coupled transistors and virtually no current flows through other transistors therein even if its base potential is at "H". Therefore, ON/OFF states of transistors in ECL circuits are different from ON/OFF states of switching elements operating between the saturation region and the cutoff region.

Under such state, the input ECL circuit formed of the bipolar transistors 18 and 19 performs a switching operation in response to "H" or "L" level of the input signal IN and a current flows through either of the transistors 18 and 19 in accordance with the level of the input signal IN. The reference voltage $V_{BB}$ is usually set to a value in the middle between the "H" level and "L" level of the input signal IN. The base potentials of the transistors 26 and 27 are determined in accordance with the current flowing through the transistor 18/19 and, hence, the input master circuit 83 is brought to the through state where a current input signal IN is immediately output. Here, the base potentials of the transistors 26 and 27 are determined depending on the emitter follower operation of the bipolar transistor 22 and 23 and the level shifting operation of the diodes 24 and 25.

Meanwhile, in the input slave circuit 84, the transistor 82 is turned on and the transistors 35 and 43 are turned off in response to the through signal TH, and a current I2 flowing through the constant current source 36 is just the current flowing through the input ECL circuit (transistors 33/34). The input ECL circuit (transistors 33/34) is supplied, as an input signal thereto, with the output signal of the input master circuit 83. Hence, the input slave circuit 84 allows the signal supplied by the input master circuit 83 to be output from the output terminals A and NA.

Therefore, the input retaining circuit 8 assumes the through state when the through signal TH is at "H" (level "H" higher than "H" of the clock signal CLKB, NCLKB), no mater whether the external clock signal CLK is at "H" or "L".

Now, we consider the case where the through signal TH is set to be equal to or lower than "L" of the internal clock signals CLKB and NCLKB from the clock generator 9.

Figure 4:
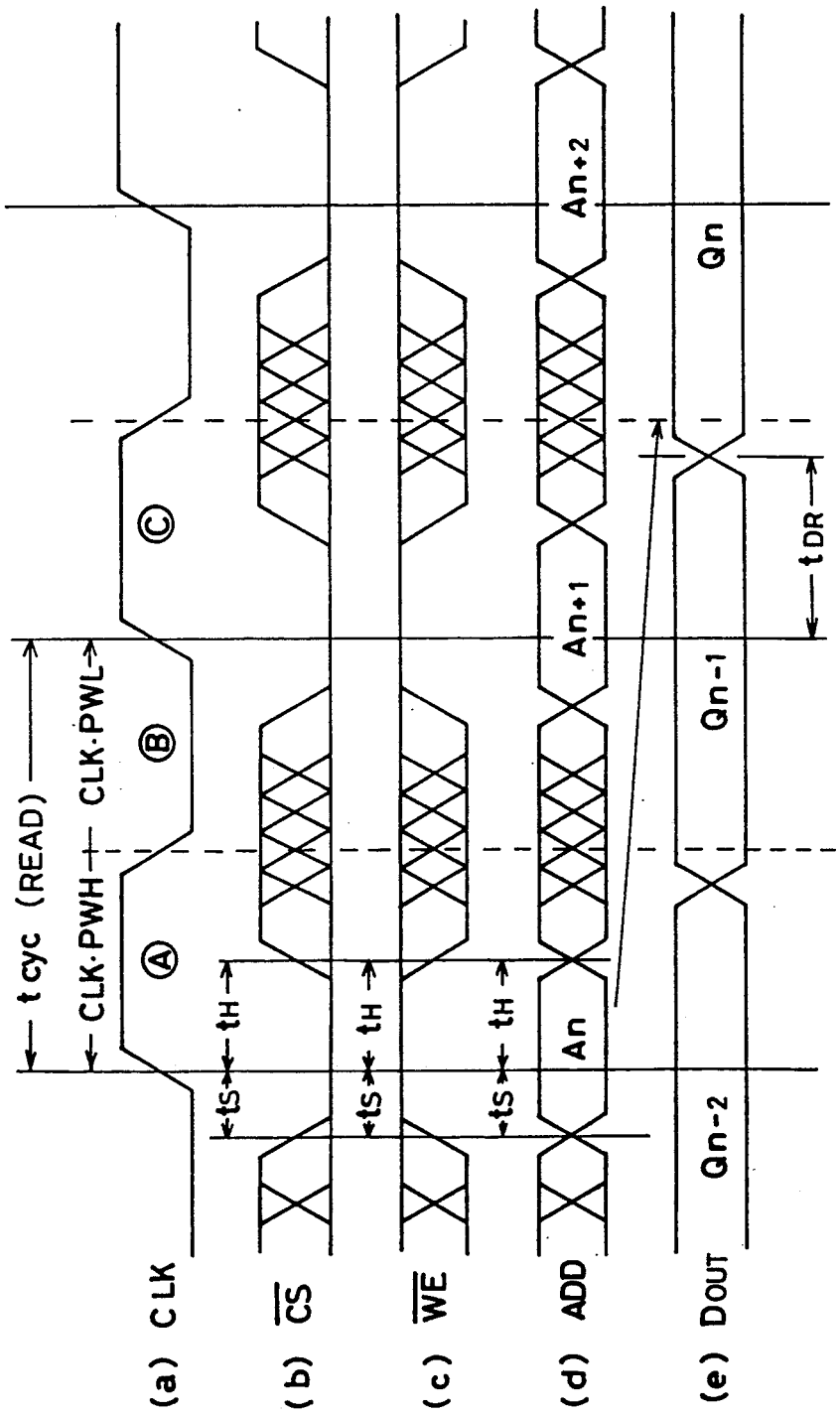
FIG. 4 is a signal waveform diagram showing operations of the STRAM shown in FIG. 3 in data reading.

Under such state, the internal clock signal NCLKB from the internal clock generator 9 is at "L" and the internal clock signal CLKB is at "H" during the period Ⓐ shown in FIG. 4, i.e., when the external clock signal CLK is at "H". In this state, the bipolar transistors 81 and 20 of the input master circuit 83 are held off and the bipolar transistor 28 of the same is held on. Hence, no current flows through the input ECL circuit (transistors 18 and 19) and a current flows through the path of the input latch circuit (transistors 26 and 27). More specifically, the current I1 supplied by the constant current source 21 is allowed to flow from the first power supply line $V_{CC}$ 47 to the second power source potential $V_{EE}$ 48 through the resistor 16 or 17, the bipolar transistor 26 or 27, the bipolar transistor 28, and the constant current source 21. When the through signal TH is at "L", the input ECL circuit formed of the bipolar transistors 18 and 19 does not perform the switching operation and the latch ECL circuit formed of the bipolar transistors 26 and 27 latches the input data. Thus, the input master circuit 83 assumes the latch state.

Meanwhile, in the input slave circuit 84, the bipolar transistor 35 is turned on and the bipolar transistors 82 and 43 are turned off and, hence, the current I2 supplied by the constant current source 36 flows from the first power source potential 47 ($V_{CC}$) to the second power source potential $V_{EE}$ 48 through the resistor 31 or 32, the bipolar transistor 33 or 34, the bipolar transistor 35, and the constant current source 36. Hence, in the input slave circuit 84, the input ECL circuit formed of the bipolar transistors 33 and 34 performs the switching operation in accordance with the output of the master circuit 83 and, thus, the input slave circuit 84 assumes the through state.

Now, we consider the operation during the period Ⓑ shown in FIG. 4, i.e., when the external clock signal CLK is at "L", under the condition of the through signal TH being lower than or virtually equal to "L" of the internal clock NCLKB, CLKB from the internal clock generator 9. At this time, the internal clock signal NCLKB is brought to "H" and the internal clock signal CLKB is brought to "L" and, hence, the bipolar transistor 81 of the input master circuit 83 is turned off and the bipolar transistor 20 of the same is turned on. Therefore, the current I1 supplied by the constant current source 21 is passed from the first power source potential 47 ($V_{CC}$) to the second power source potential 48 ($V_{EE}$) through the resistor 16 or 17, the bipolar transistors 18 or 19, the bipolar transistor 20, and the constant current source 21. Thus, the input ECL circuit formed of the bipolar transistors 18 and 19 performs the switching operation in accordance with the input signal IN being at "H" or "L" and, thus, the input master circuit 83 assumes the through state.

Meanwhile, in the input slave circuit 84, under such state, the bipolar transistor 43 is turned on and the bipolar transistors 82 and 35 are turned off and, hence, the current I2 supplied by the constant current source 36 is passed from the first power source potential 47 ($V_{CC}$) to the second power source potential 48 ($V_{EE}$) through the resistor 31 or 32, the bipolar transistor 41 or 42, the bipolar transistor 43, and the constant current source 36. Hence, in the input slave circuit 84, the input ECL circuit formed of the bipolar transistors 33 and 34 performs no switching operation regardless of the output from the input master circuit 83, and the input data is latched by the ECL circuit formed of the bipolar transistors 41 and 42 to be output as output data A and NA and, thus, the input slave circuit 84 assumes the latch state.

Therefore, in the case where the through signal TH is lower than or virtually equal to "L" of the internal clock signals NCLKB and CLKB, the input master circuit 83 assumes the latch state and the input slave circuit 84 assumes the through state during the period Ⓐ, while the input master circuit 83 assumes the through state and the input slave circuit 84 assumes the latch state during the period Ⓑ, the same as in the circuit shown in FIG. 5.

The output data retaining circuit will be described below.

Figure 10:
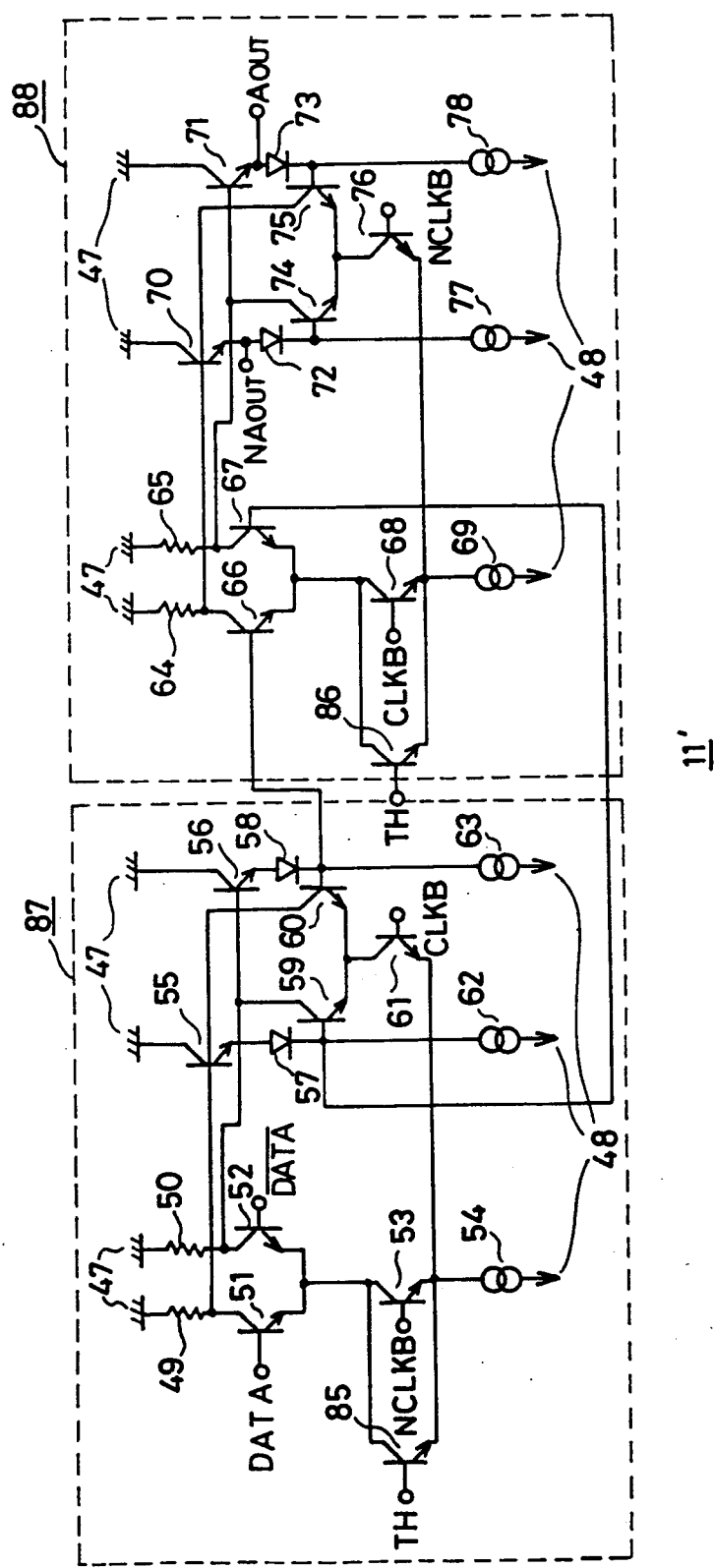
FIG. 10 is a diagram showing an example of a specific structure of an output data retaining circuit for use in a semiconductor integrated circuit according to an embodiment of the present invention.

FIG. 10 is a diagram showing an example of structure of an output data retaining circuit of the semiconductor integrated circuit according to the present invention. The output data retaining circuit shown in FIG. 10 is an improved example of the output data retaining circuit 11 shown in FIG. 6 and have the corresponding parts to those in FIG. 6 denoted by like reference numerals. The output data retaining circuit 11' shown in FIG. 8 includes an output master circuit 87 and an output slave circuit 88. The output master circuit 87 includes the arrangement of the output master circuit 79 shown in FIG. 6 and, in addition, an npn bipolar transistor 85 connected in parallel with the transistor 53 and having its base supplied with the through signal TH. The output master circuit 87 comprises an input ECL circuit formed of bipolar transistors 51 and 52 having their bases supplied with complementary data (complementary output data from the sense amplifier) DATA and $\overline{\text{DATA}}$, respectively, a latch ECL circuit formed of npn bipolar transistors 59 and 60, a mode switching ECL circuit formed of npn bipolar transistors 85, 53, and 61, and an emitter follower circuit formed of npn bipolar transistors 55 and 56, diodes 57 and 58, and constant current sources 62 and 63. The mode switching ECL circuit establishes a current flow path for either of the input ECL circuit formed of the transistors 51 and 52 and the latch ECL circuit formed of the transistors 59 and 60.

Figure 6:
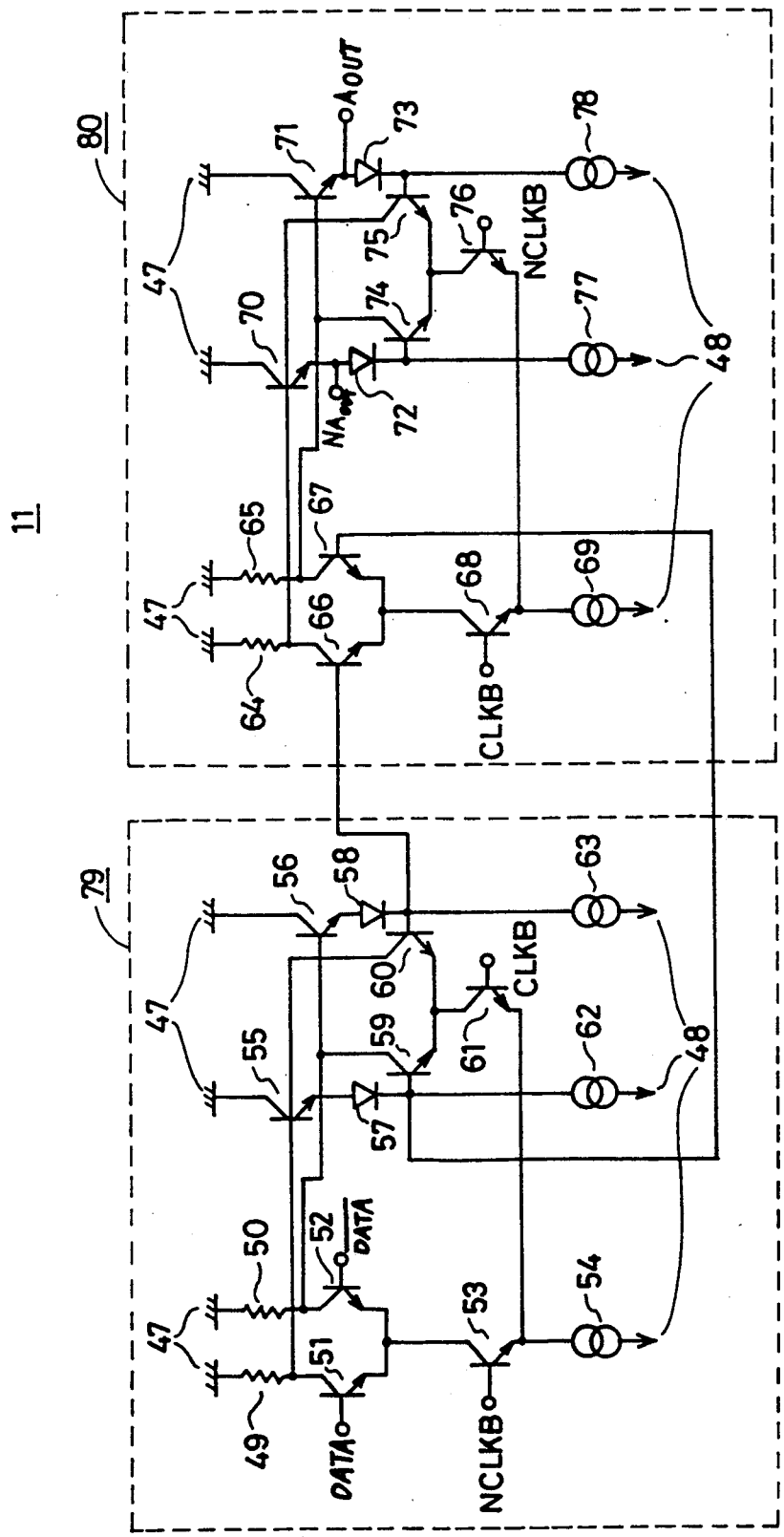
FIG. 6 is a circuit diagram showing the output data retaining circuit of the STRAM shown in FIG. 3.

The output slave circuit 88 includes, in addition to the circuit configuration shown in FIG. 6, an npn bipolar transistor 86 connected in parallel with the npn bipolar transistor 68 and having its base supplied with the through signal TH. The output slave circuit 88, similarly to the output master circuit, comprises an input ECL circuit (transistors 66 and 67), a latch ECL circuit (transistors 74 and 75), and a mode switching ECL circuit (transistors 86, 68, and 76).

The operation of the output data retaining circuit 11' is similar to that of the input data retaining circuit shown in FIG. 9, only differing therefrom in that the input signals supplied to the output master circuit 87 are the output signals DATA and $\overline{\text{DATA}}$ from the sense amplifier. More specifically, when the through signal TH is higher than "H" of the internal clock signals NCLKB, CLKB, the output master circuit 87 and the output slave circuit 88 assume the through state no matter whether the external clock signal CLK is at "H" or at "L", and when the through signal TH is lower than or virtually equal to "L" of the internal clock signals NCLKB, CLKB, the output master circuit 87 assumes the latch state and the output slave circuit 88 assumes the through state during the period that the external clock signal CLK is at "H", whereas the output master circuit 87 assumes the through state and the output slave circuit 88 assumes the latch state during period that the external clock signal CLK is at "L".

Figure 1:
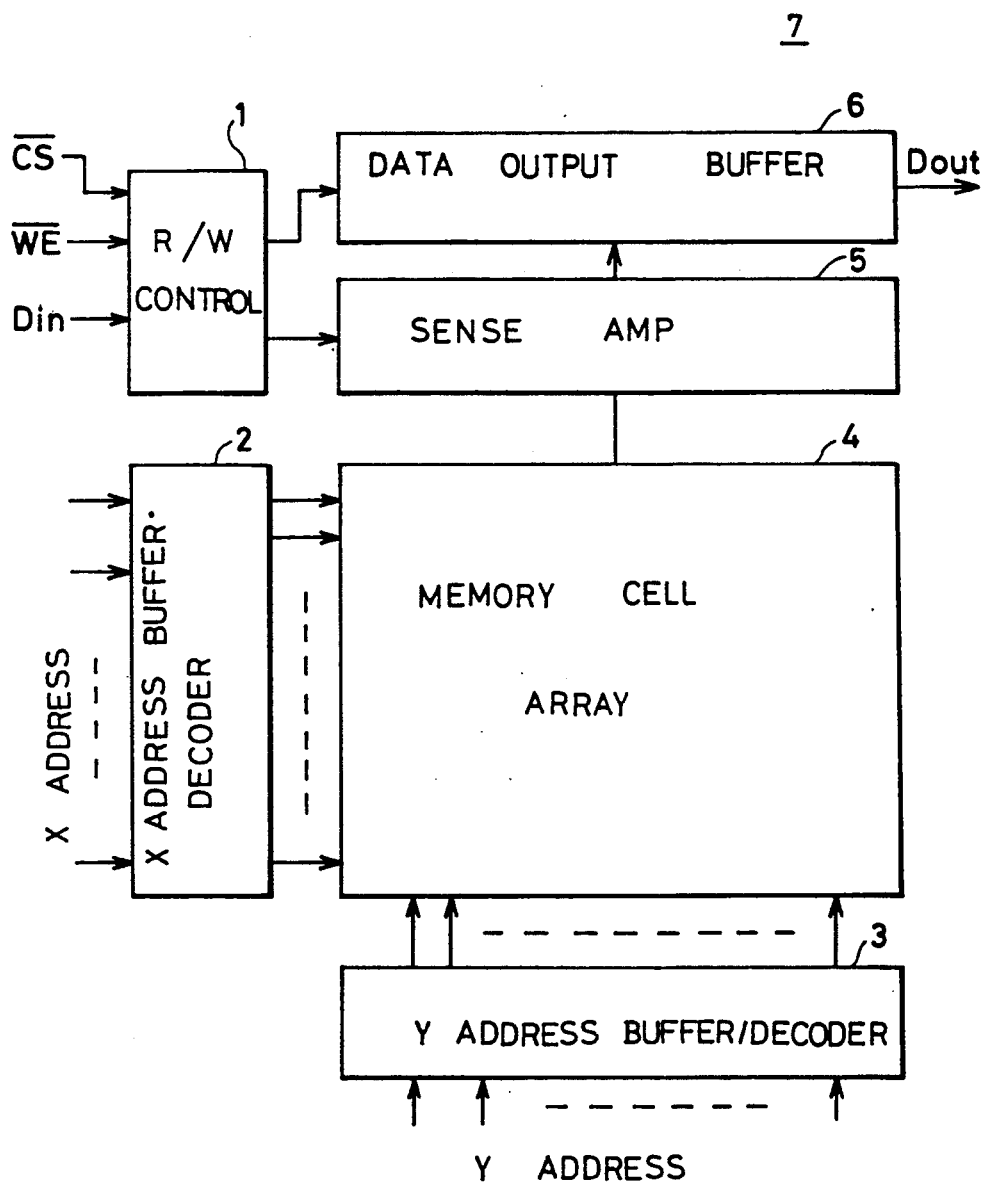
FIG. 1 is a diagram showing an example of structure of a conventional standard RAM.
Figure 2:
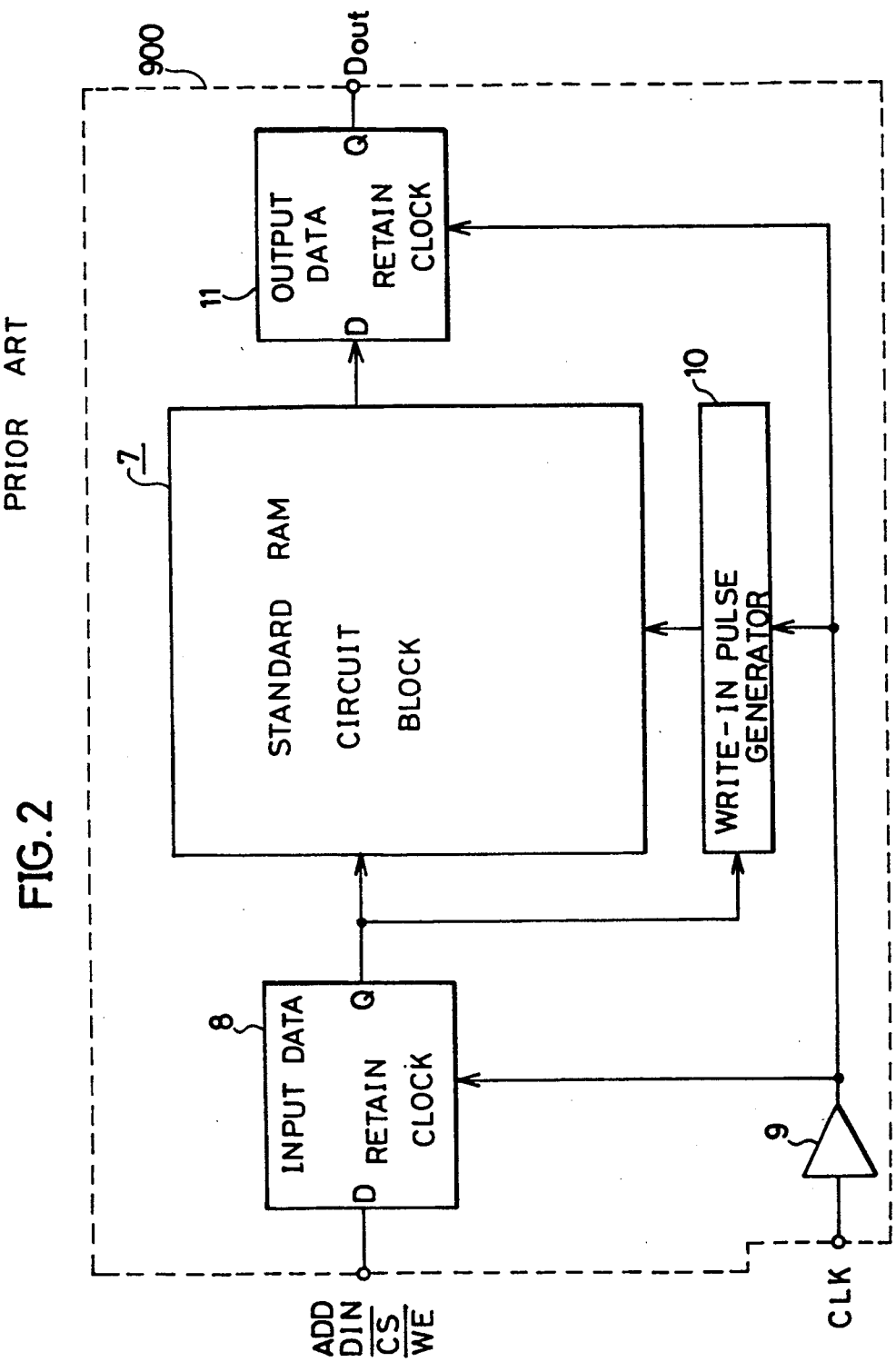
FIG. 2 is a diagram showing a conceptional structure of a STRAM.
Figure 3:
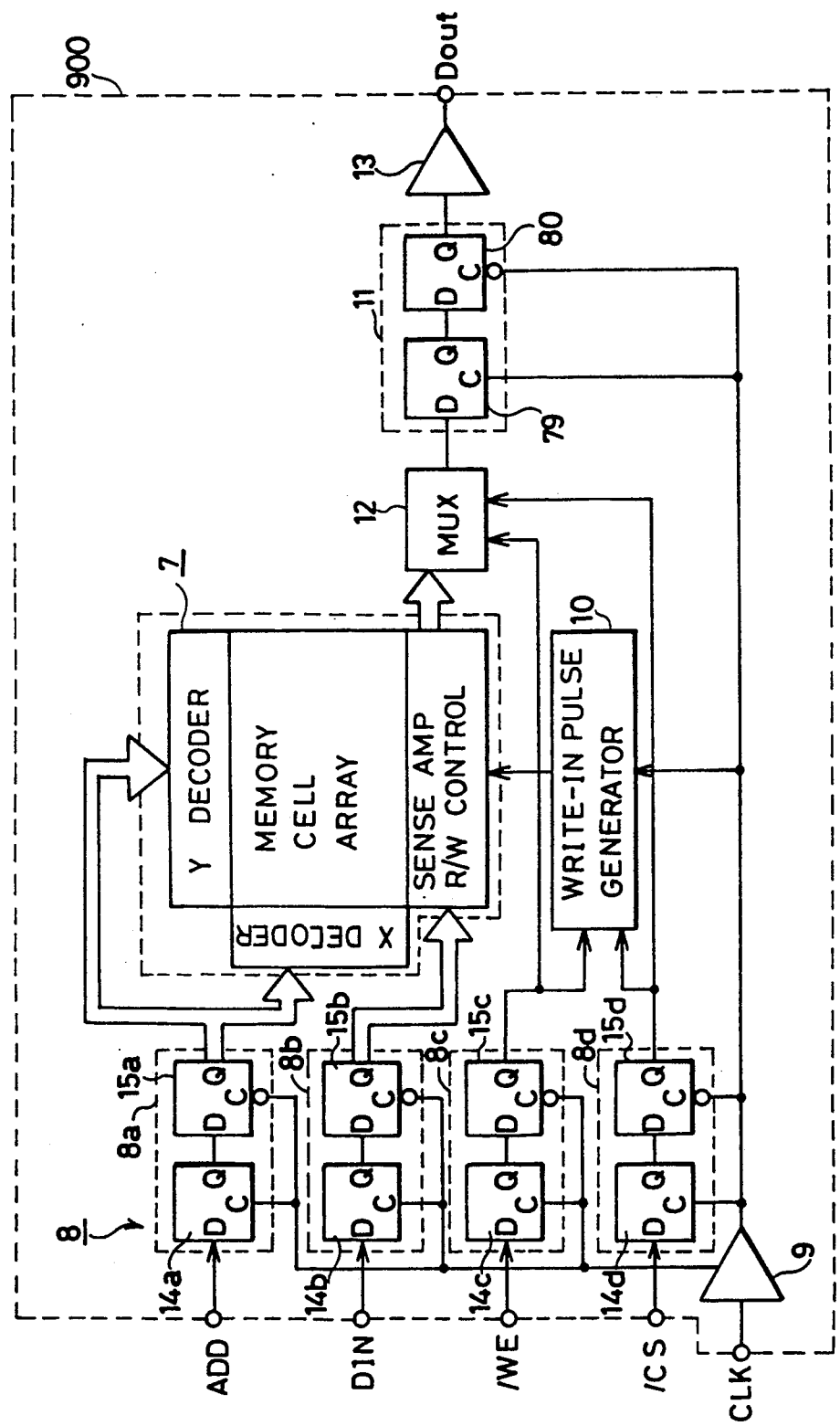
FIG. 3 is a block diagram showing an example of a specific structure of a STRAM.

Thus, the present semiconductor integrated circuit performs the operation as in the standard RAM shown in FIG. 1 or the operation as in the STRAM shown in FIG. 3 according as the through signal TH is at "H" level or at "L" level. Therefore, when it is desired to make such a test as to check access time of internal circuitry of the chip or to confirm the operation of memory cells, the test can be performed by bringing the through signal TH to "H", thereby having the semiconductor integrated circuit operating as a standard RAM. When checking whether or not the semiconductor integrated circuit is properly working as a STRAM, the functional test can be performed with the through signal TH brought to "L".

Considering now a case where the through signal TH is brought to "H", the write-enable signal $\overline{\text{WE}}$ and chip-select signal $\overline{\text{CS}}$ are passed through to be supplied to the write pulse generating circuit 10 shown in FIG. 3. The write pulse generating circuit 10, depending on the state of the write-enable signal $\overline{\text{WE}}$ and chip-select signal $\overline{\text{CS}}$, supplies a write pulse to the R/W control circuit at a predetermined timing in response to the rise of the clock signal from the clock generator 9. When the address access time required for data reading, i.e., the time required to obtain valid output data after an address has been changed, is to be checked, the R/W control circuit activates the sense amplifier and inhibits data writing in order to achieve the data read operation. Accordingly, when the address access time is to be checked, a write pulse is not generated by the write pulse generating circuit 10. Therefore, the standard RAM block 7 performs the same data-read operation a in the standard RAM shown in FIG. 1.

On the other hand, the multiplex circuit 12, when the data-read mode is set up in response to the chip-select signal $\overline{\text{CS}}$ and write-enable signal $\overline{\text{WE}}$, connects its input to the output of the sense amplifier, so that the output of the sense amplifier is selected and supplied to the output data retaining circuit 11. Since the mode is set to the data-read mode when the address access time is to be measured, the write-enable signal $\overline{\text{WE}}$ is at "H" level when the chip-select signal $\overline{\text{CS}}$ comes in. In a standard RAM, the write-enable signal $\overline{WE}$ is normally generated after the chip-select signal $\overline{CS}$ has been brought into the activation state at "L", and therefore, the multiplex circuit 12, even in this through state, selects the output of the sense amplifier and allows it to pass therethrough, the same as in the operation as the STRAM.

Generally, in a standard RAM, the write cycle is started after both the write-enable signal $\overline{WE}$ and the chip-select signal $\overline{CS}$ are turned to "L". If the clock signal CLK is supplied at the same time as the later fall to "L" of the above two signals, the R/W control circuit performs the same operation as that in the standard RAM. Also, by adapting the write pulse generating circuit 10 to supply the write-enable signal $\overline{WE}$ and chip-select signal $\overline{CS}$ to the R/W control circuit in response to the through signal TH, the same circuit arrangement as that of the standard RAM shown in FIG. 1 can be realized.

However, there occurs no particular problem if the write pulse generating circuit 10 is activated when the clock signal is supplied thereto from the clock generator 9 in response to the clock signal CLK, and the write pulse is generated in response to the write-enable signal $\overline{WE}$ and the chip-select signal $\overline{CS}$ supplied from the input data retaining circuits 8c and 8d. Since the data-write cycle time is virtually equal to the data-read cycle time, even if the write pulse generating circuit 10 is adapted t be activated in response to the internal clock signal from the clock generator as heretofore, similar operation to that in an ordinary standard RAM can be achieved.

Figure 11:
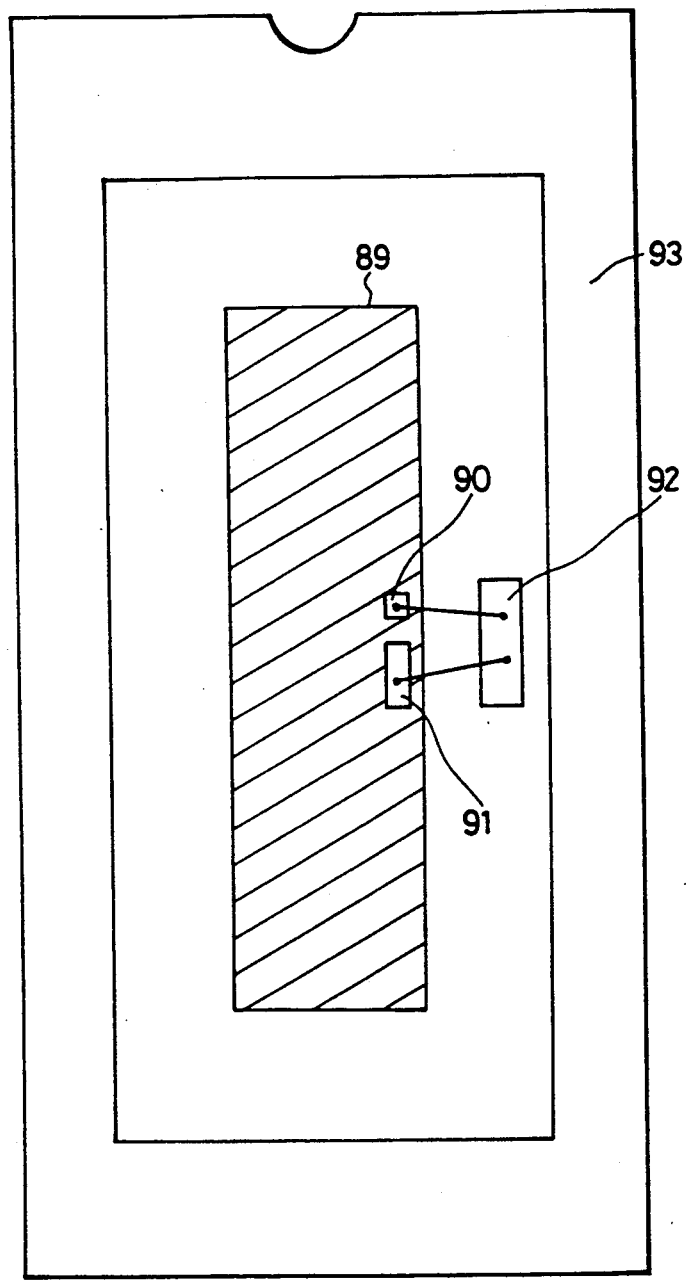
FIG. 11 is a circuit diagram showing an example of a through signal generating circuit in a semiconductor integrated circuit according to the present invention.

A method to generate the through signal TH will be described below. In a general-purpose memory, the number and arrangement of the external pins of the semiconductor integrated circuit is predetermined, and, therefore, if there is available any unused, idle pin, the idle pin may be used for the through signal with the through signal TH externally supplied.

Where there is no such idle pin, the arrangement shown in FIG. 11 may be used.

FIG. 11 is a diagram showing an example of arrangement of the through signal TH generating circuit. Referring to FIG. 11, there is installed a semiconductor integrated circuit chip 89 within a package 93. The semiconductor chip 89 is provided with bonding pads. Each of the pads is connected with a lead terminal on a frame 92 included in the package 93 with a wire. In such arrangement, a pad 90 for the through signal TH may be disposed in the vicinity of a $V_{EE}$ power supply pad 91 for supplying the second power source potential $V_{EE}$ and the pad 90 for the through signal TH may be short-circuited with the second power source potential $V_{EE}$ by bonding, so that the through signal TH is fixed to "L". Thus, in this assembled state where the semiconductor integrated circuit is installed in the package, the functional test is carried out only for the device operating as a STRAM. This structure corresponds to that shown in FIG. 7.

In testing of a semiconductor integrated circuit (LSI), in general, function tests are performed for each of the chips at the stage in which they are arranged on a wafer and, after only those chips that have been determined to be good products in such function tests are installed in packages, they are subjected to postpackaging function tests.

In the state of chips arranged on a wafer, the through signal TH can be externally applied to each retaining circuit by the use of a probe card or the like capable of applying desired test signals to each of the pads or nodes of the semiconductor chips, and therefore, the semiconductor integrated circuit can be subjected to function tests under operating conditions both as the standard RAM and as the STRAM.

Accordingly, when the pad 90 for the through signal TH is disposed in the vicinity of the pad 91 for second power source potential $V_{EE}$ as shown in FIG. 11 and it is arranged such that the pads 90 and 91 are short-circuited by wiring at the time of the assembly of the chip of the semiconductor integrated circuit, it becomes possible to externally apply the through signal to the semiconductor integrated circuit in a chip form and, hence, it is made possible to carry out the function tests of the semiconductor integrated circuit both as a standard RAM and as a STRAM. Thus, the access time of the standard RAM block can be measured without changing the cycle time and the like and the operation of the semiconductor integrated circuit as the STRAM can also be verified.

By switching the two operating manners, it is made possible in the failure analysis of the semiconductor integrated circuit to determine whether a failure is that occurring in the input and output data retaining circuits and the clock circuit or that occurring in a memory cell and peripheral circuits of the memory. Thus, it becomes possible to perform the failure analysis more easily.

Figure 12:
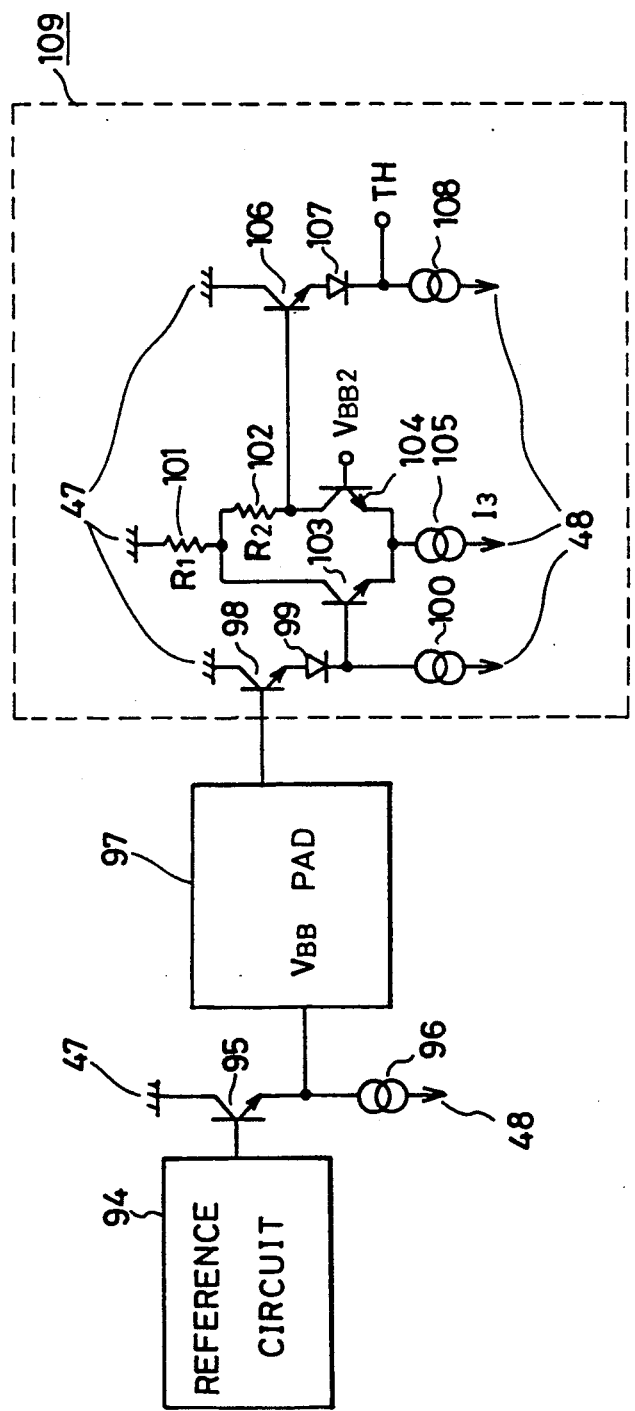
FIG. 12 is a circuit diagram showing a second through signal generating circuit and its peripheral circuitry.

FIG. 12 is a diagram showing another circuit configuration for generating the through signal TH. In the configuration shown in FIG. 12, the through signal TH is generated within the chip of a semiconductor integrated circuit. Referring to FIG. 12, a through signal generating circuit 109 generates the through signal TH in response to the reference voltage $V_{BB}$ generated by a reference circuit 94. The through signal generating circuit 109 includes an npn bipolar transistor 98 receiving, in an emitter follower manner, a voltage from a $V_{BB}$ pad 97, emitter-coupled npn bipolar transistors 103 and 104 comparing a potential of the emitter output of the npn bipolar transistor 98 transmitted thereto through a level shifting diode 99 with a second reference potential $V_{BB2}$, an npn bipolar transistor 106 transmitting, in an emitter follower manner, the collector potential of the npn bipolar transistor 104, and a level shifting diode 107 level shifting the emitter potential of the transistor 106, for providing the through signal.

A constant current source 100 is provided between the diode 99 and the second power source potential $V_{EE}$ 48, a second constant current source 105 is provided between the common emitters of the emitter-coupled transistors 103 and 104 and the second power source potential $V_{EE}$ 48, and a constant current source 108 is provided between the diode 107 and the second power source potential $V_{EE}$ 48.

The collector of the transistor 104 is connected with the first power source potential 47 ($V_{CC}$) through resistors 101 and 102. The collector of the transistor 103 is connected with the first power source potential 47 ($V_{CC}$) through the resistor 101.

The $V_{BB}$ pad 97 is connected with the emitter of an npn bipolar transistor 95 disposed within the semiconductor integrated circuit for receiving, in an emitter follower manner, the output of the reference circuit 94 generating the reference voltage $V_{BB}$. Between the emitter of the npn bipolar transistor 95 and the second power source potential $V_{EE}$ 48, there is provided a constant current source 96. The operation will be described below.

Figure 13:
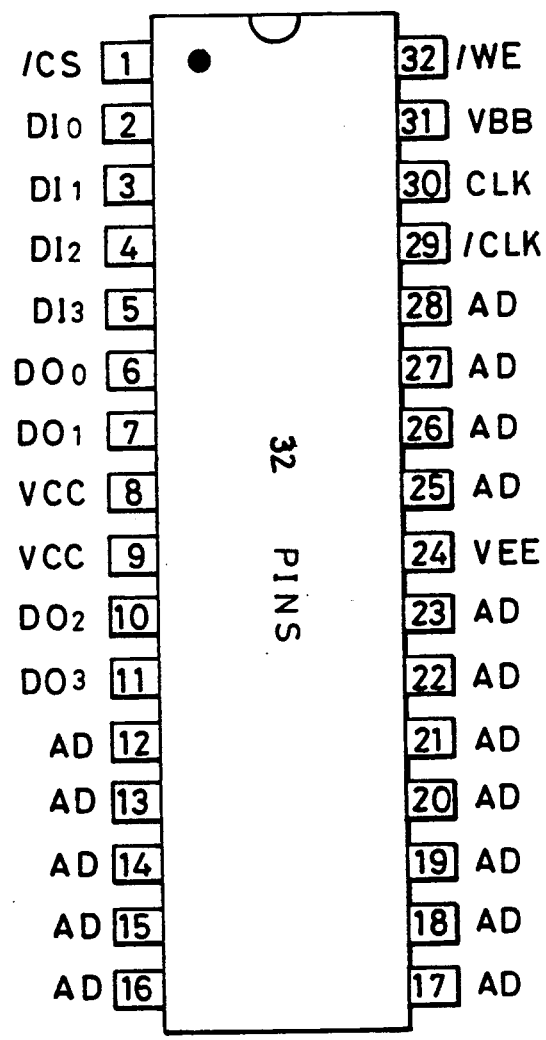
FIG. 13 is a diagram showing an example of external pin arrangement of the semiconductor integrated circuit in a packaged state.

To make the explanation of the operation in FIG. 12 easy, an example of arrangement of pins for a semiconductor integrated circuit is shown in FIG. 13. The pin arrangement shown in FIG. 13 is that for a STRAM of 64K words×4 bits. Referring to FIG. 13, the semiconductor integrated circuit has 32 external pins, of which the pin of pin number 1 is supplied with the chipselect signal $\overline{CS}$, the pins of pin number 2 to pin number 5 are supplied with input data DI0 to DI3, and the pins of pin numbers 6, 7, 10, and 11 are supplied with output data DO0 to DO3. The pins of pin numbers 8 and 9 are supplied with the first power source potential $V_{CC}$. The pins of pin numbers 12 to 23 and 25 to 28 are supplied with address signals AD. The pin of pin number 24 is supplied with the second power source potential $V_{EE}$ and the pins of pin numbers 29 and 30 are supplied with the external clock signals CLK and $\overline{CLK}$. The pin of pin number 31 is supplied with the reference voltage $V_{BB}$. The pin of pin number 32 is supplied with the write-enable signal $\overline{WE}$. The $V_{BB}$ pin of pin number 31 is a pin terminal provided for taking the reference potential generated within the semiconductor integrated circuit chip to the outside of the chip. Accordingly, the $V_{BB}$ pin of pin number 31 is only outputting the reference potential from the interior of the chip and no external signal is supplied thereto. The through signal generating circuit 109 shown in FIG. 12 utilizes the $V_{BB}$ pin of pin number 31 for generating the through signal TH within the chip.

The reference potential generated by the reference circuit 94 is normally utilized in an internal circuit as a reference voltage for comparing therewith the input to an ECL circuit or the like.

The reference potential generated by the reference circuit 94 is level-shifted by the emitter follower circuit formed of the bipolar transistor 95 and the constant current source 96 and is output to the $V_{BB}$ pad 97. The reference potential output to the $V_{BB}$ pad 97 is normally −1.3 V.

On the other hand, the second reference potential $V_{BB2}$ is set to −2.1 V. This potential is generated, for example, by passing the reference voltage $V_{BB}$ generated by the reference circuit 94 through a level shift means formed of a diode or the like.

Now, if the base-emitter voltage of the transistor 98 is set to $V_{BE}$ and the forward voltage drop of the diode 99 is also set to $V_{BE}$, the base potential of the bipolar transistor 103 becomes such a level as level-shifted from −1.3 V by 2·$V_{BE}$, i.e., about −2.9 V. As a result, the bipolar transistor 104 is turned on, and a current I3 flows to the second power source potential 48 ($V_{EE}$) through the resistors 101 and 102, the bipolar transistor 104, and the constant current source 105. Accordingly, the level of the through signal TH becomes the level obtained by level-shifting the collector potential of the transistor 104 by 2·$V_{BE}$, i.e., its level becomes $$V_{CC}-(I3(R1+R2)+2\cdot V_{BE})$$

and it goes to "L". By setting the resistance values of the resistors R1 and R2 to suitable values, it becomes possible to set the potential level of the through signal TH to a level lower than "L" level of the internal clock signals NCLKB and CLKB. When the through signal generating circuit 109 is adapted to receive the reference voltage from the reference circuit 94, since the through signal TH is held at "L" in the normally packaged state of a chip, the semiconductor integrated circuit operates as a STRAM and the testing mode becomes that to test it as a STRAM.

When it is intended, for the purpose of measuring an access time, to bring the semiconductor integrated circuit to the testing mode in which it operates as a standard RAM, the through signal TH is brought to "H". To achieve this, a relatively high potential, the first power source potential $V_{CC}$, for example, is externally applied to the $V_{BB}$ pad 97. Then, the base potential of the bipolar transistor 103 becomes $V_{CC}$−2·$V_{EE}$, i.e., about −1.6 V. Hence, the bipolar transistor 103 is turned on and the bipolar transistor 104 is turned off, and the current I3 flows to the second power source potential $V_{EE}$ through the resistor 101, the bipolar transistor 103, and the constant current source 105. As a result, the potential of the through signal TH becomes, with the base-emitter voltage of the bipolar transistors 106 and the forward voltage drop of the diode 107 set to $V_{BE}$, $$V_{CC}-(I3\cdot R1+2\cdot V_{BE})$$

and the signal goes to "H". By setting the value of the resistor R1 to a suitable value, the potential level of "H" of the through signal TH can be set above "H" level of the internal clock signals NCLKB and CLKB.

When the first power source potential $V_{CC}$ is applied to the $V_{BB}$ pad 97, the emitter potential of the bipolar transistor 95 is brought to $V_{CC}$ and it becomes higher than the base potential of the bipolar transistor 95 (1.3 V +$V_{BE}$= −0.5 V) and, hence, the bipolar transistor 95 is in a cut off state. Therefore, even if the first power source potential $V_{CC}$ is applied to the $V_{BB}$ pad 97, this potential is not transmitted to the internal reference circuit 94.

Figure 14:
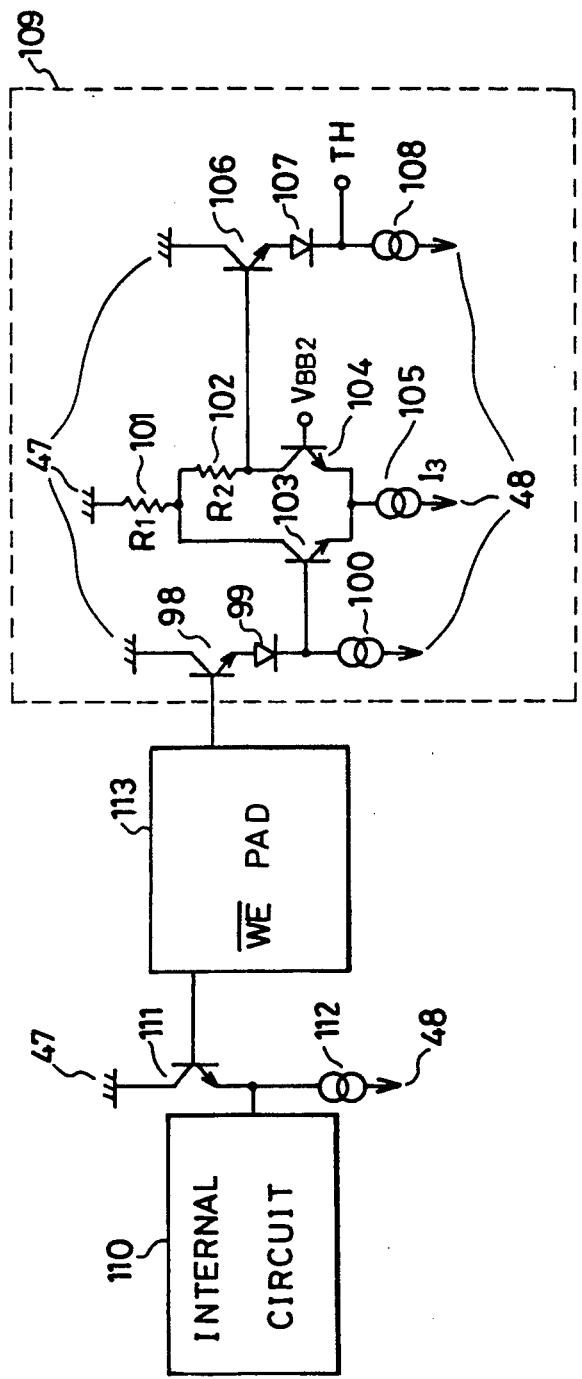
FIG. 14 is a diagram showing a structure of a third embodiment of a through signal generating circuit and its peripheral circuitry.

FIG. 14 is a diagram showing another arrangement for generating the through signal TH. Referring to FIG. 14, though the through signal generating circuit has the same configuration as the through signal generating circuit shown in FIG. 12, the base of the input emitter follower transistor 98 is connected with a pad 113 receiving the write-enable signal $\overline{WE}$. The output of the pad 113 receiving the write-enable signal $\overline{WE}$ is transmitted, for example, to the input data retaining circuit 8c shown in FIG. 3 through an emitter follower transistor 111. In this FIG. 14, the circuit receiving the write-enable signal is shown as an internal circuit 110. The reason why it is shown just as the internal circuit 110 is because there is, for example, such a case where the write-enable signal is transmitted to the input data retaining circuit 8c after being shifted to a desired level. The operation will be described below.

Normally, the $\overline{WE}$ pad 113 is supplied with an input at the ECL level, i.e., a signal whose "H" is −0.9 V and "L" is −1.7 V. Accordingly, the base potential of the bipolar transistor 103 becomes such a level as level-shifted by 2·$V_{BE}$ from −0.9 V or −1.7 V, i.e., about −2.5 V or −3.3 V. The second reference voltage $V_{BB2}$ supplied to the base of the bipolar transistor 104 is −2.1 V and, hence, the bipolar transistor 104 is turned on no matter whether the write-enable signal $\overline{WE}$ is at "H" or at "L". Therefore, a current I3 flows through the resistors 101 and 102, the bipolar transistor 104, and the constant current source 105. As a result, the through signal TH goes to "L" and the value, with the base-emitter voltage of the bipolar transistor 106 set to voltage $V_{BE}$ and the forward voltage drop of the diode 107 set to the value the same as the base-emitter voltage $V_{BE}$ of the bipolar transistor, becomes $$V_{CC}-(I3(R1+R2)+2\cdot V_{BE}).$$

Therefore, by setting the resistance values of the resistors 101 and 102 to suitable values, the through signal TH can be set to a potential lower than "L" level of the internal clock signals NCLKB and CLKB. Since the input of the through signal generating circuit 109 is connected with the pad 113 receiving the write-enable signal $\overline{WE}$ and, hence, the through signal TH is held at "L" in the normal mode, and the semiconductor integrated circuit operates as a STRAM.

When it is intended, for measuring an access time, to bring the semiconductor integrated circuit to the mode in which it operates as a standard RAM shown in FIG. 1, it is necessary to bring the through signal TH to "H". In such case, while the write-enable signal $\overline{WE}$ is set to "H" for the measurement of the access time, a relatively higher potential such as the first power source potential $V_{CC}$, for example, is externally applied to the pad 113. Then, the base potential of the bipolar transistor 103 is brought to $V_{CC}-2\cdot V_{BE}$, i.e., about $-1.6$ V. Hence, the transistor 103 is turned on and the bipolar transistor 104 is turned off, and the current I3 flows through the resistor 101, the bipolar transistor 103, and the constant current source 105. Accordingly, the potential of the through signal TH becomes $$V_{CC}-(I3\cdot R1+2\cdot V_{BE})$$

and goes to "H" level. Therefore, by setting the resistance value of the resistor R1 to a suitable value, it becomes possible to set the potential of the through signal TH higher than "H" level of the internal clock signals NCLKB and CLKB and to cause the semiconductor integrated circuit to operate as a standard RAM.

In data reading as described above, the effect on the internal circuit of the application of the potential $V_{CC}$ to the pad 113 for the write-enable signal $\overline{WE}$ is only the level shift of the emitter potential of the bipolar transistor 111 from $-1.7$ V to $-0.8$ V, and therefore, no particular problem arises if circuit parameters of the internal circuit 110 are set most suitably by adjusting, for example, the reference potential at the signal input port of the internal circuit 110. The signal input port of the internal circuit 110 here has the circuit configuration as shown in FIG. 9 and the input port includes an ECL circuit. When the emitter output of the transistor 111 is directly applied to the input ECL circuit, no particular problem arises if the value of the reference potential $V_{BB}$ is set to an intermediate value between "L" and "H" of the internal write-enable signal. With the above described arrangement, even if the semiconductor integrated circuit is such that is provided with no reference potential $V_{BB}$ pad for a terminal of the package, switching of the operational modes of the semiconductor integrated circuit can be achieved.

Figure 15:
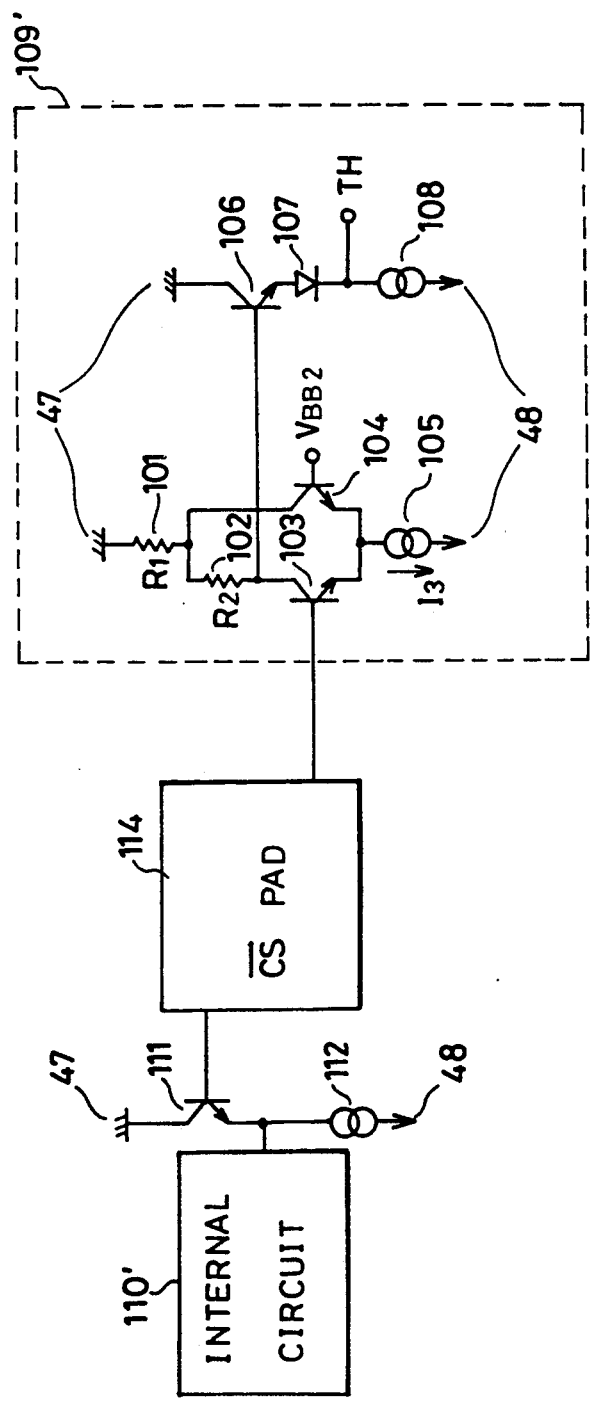
FIG. 15 is a diagram showing a structure of a fourth embodiment of a through signal generator circuit and its peripheral circuitry.

FIG. 15 is a diagram showing still another circuit configuration for generating the through signal TH. In the circuit configuration shown in FIG. 15, a through signal generating circuit 109, generates the through signal TH in response to the chip-select signal $\overline{CS}$. The structure of the through signal generating circuit 109, is different from that of the through signal generating circuits shown in FIG. 12 and FIG. 14 in that the input from the pad 114 supplied with the chip-select signal $\overline{CS}$ is directly received by the ECL circuit for comparison with the reference potential $V_{BB2}$. More specifically, the through signal generating circuit 109' includes an input ECL circuit formed of the bipolar transistors 103 and 104 and the circuit portion receiving, in an emitter follower manner, the output of the input ECL circuit for level-shifting and providing on the output. The input ECL circuit includes a bipolar transistor 103 receiving the potential of the pad 114 at its base, a bipolar transistor 104 receiving the second reference potential $V_{BB2}$ at its base, and resistors 101 and 102 for connecting the collector of the transistor 103 with the first power source potential $V_{CC}$ 47. The collector of the transistor 104 is connected with the first power source potential $V_{CC}$ 47 through the resistor 101.

The npn bipolar transistor 106 in the emitter follower has its base connected with the collector of the bipolar transistor 103 and its emitter connected with the output node through the diode 107.

The potential of the pad 114 is transmitted to the input circuit 110' through the npn bipolar transistor 111 operating in an emitter follower manner. The internal circuit 110' corresponds to the input data retaining circuit 8d shown in FIG. 3. The emitter of the transistor 111 is connected with the second power source potential 48 ($V_{EE}$) through a constant current source 112. The operation will be described below.

The second reference potential $V_{BB2}$ is set to $-2.1$ V. The chip-select signal $\overline{CS}$ supplied to the pad 114 is normally of the ECL level of which "H" is $-0.9$ V and "L" is $-1.7$ V. In this circuit configuration, the transistor 103 is turned on no matter whether the chip-select signal $\overline{CS}$ is at "L" or at "H", and a current I3 flows through the resistors 101 and 102, the bipolar transistor 103, and the constant current source 105. Accordingly, the through signal TH goes to "L" level and its value, with the baseemitter voltage of the bipolar transistor 106 set to voltage $V_{BE}$ and the forward voltage drop of the diode 107 set to the same value as the base-emitter voltage $V_{BE}$ of the bipolar transistor, becomes $$V_{CC}-(I3(R1+R2)+2\cdot V_{BE}).$$

By setting the resistance values $R_1$ and $R_2$ of the resistors 101 and 102 to suitable values, the level "L" of the through signal TH can be set to the level lower than "L" of the internal clock signals NCLKB and CLKB. Since the through signal TH is at "L" in the normal mode, the semiconductor integrated circuit is set to the mode in which it operates as a STRAM.

In order to set the semiconductor integrated circuit to the mode in which it operates as a standard RAM as shown in FIG. 1 for measuring an access time, it is required to bring the through signal TH to "H". In such case, a relatively lower potential, $V_{EE}$, for example, is externally provided to the pad 114 for receiving the chip-select signal $\overline{CS}$. Then, the base potential of the bipolar transistor 103 is brought to the level of the second power source potential $V_{EE}$. Since the level of the second power source potential $V_{EE}$, $-4.9$ or $-5.2$ V, is sufficiently lower than the second reference potential $V_{BB2}$, $-2.1$ V, the bipolar transistor 103 is turned off and the bipolar transistor 104 is turned on. Thus, the current I3 flows through the resistor 101, the bipolar transistor 104, and the constant current source 105 and, hence, the potential of the through signal TH becomes $$V_{CC}-(I3\cdot R1+2\cdot V_{BE})$$

and goes to "H" level. Therefore, by setting the resistance value R1 of the resistor 101 to a suitable value, the potential of "H" of the through signal TH can be set to a level higher than "H" of the internal clock signals NCLKB and CLKB. Thus, the semiconductor integrated circuit can be operated as a standard RAM.

As the effect of the application of the second power source potential $V_{EE}$ to the pad 114, the base potential of the bipolar transistor 111 is brought to the level of the second power source potential $V_{EE}$ and, hence, the bipolar transistor 111 is in a cut off state and a signal at "L" is input to the internal circuit 110, by the action of the constant current source 112. When the chip is selected, the chip-select signal $\overline{CS}$ is normally at "L" level and, hence no effect is produced on the internal circuit 110 even by the application of the potential $V_{EE}$ to the pad 114. As described in the foregoing, even if there is provided no special pin terminal as one of the external terminals on the semiconductor integrated circuit package, the switching between the operating modes of the semiconductor integrated circuit can be achieved.

The input data retaining circuits, output data retaining circuits, and through signal generating circuits described in the foregoing are all constituted of ECL circuits. However, it is also possible to constitute all of these input data retaining circuits, output data retaining circuits, and through signal generating circuits of BiCMOS circuits.

Figure 16:
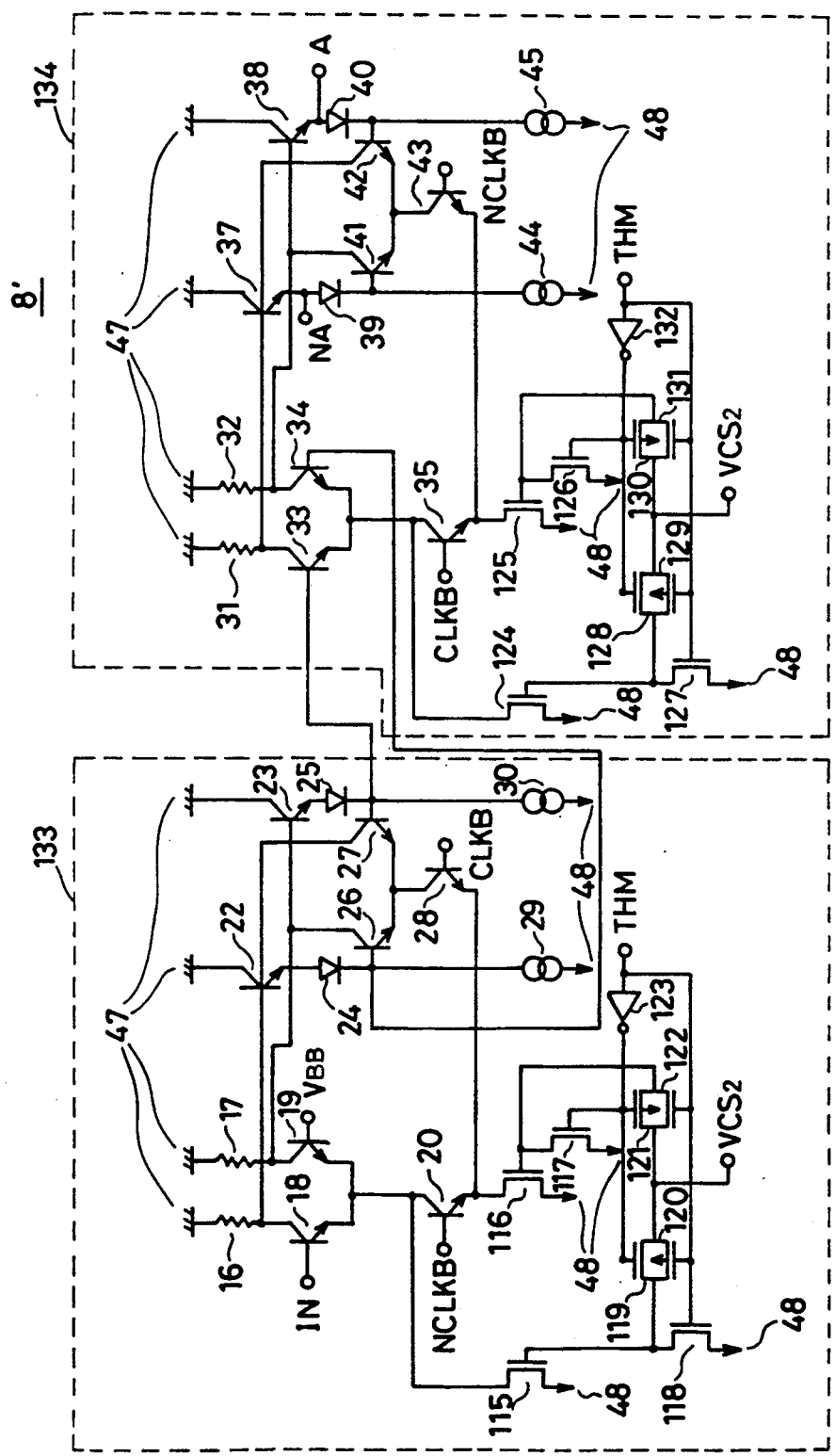
FIG. 16 is a diagram showing another structure of an input data retaining circuit according to the present invention.

FIG. 16 is a diagram showing an example of structure of an input data retaining circuit in a semiconductor integrated circuit as another embodiment of the present invention. The input data retaining circuit 8, shown in FIG. 16, includes an input master circuit 133 and an input slave circuit 134.

The input master circuit 133, different from the circuit configuration shown in FIG. 9, is provided with a constant current source for its mode switching ECL circuit (formed of transistors 20 and 28) constituted of CMOS (complementary insulated-gate field-effect) transistors whose operations are controlled by a through signal THM and, further, provided with MOS transistors for controlling the operation of the mode switching circuit in response to the through signal THM.

Input master circuit 133 includes an input ECL circuit formed of bipolar transistors 18 and 19, a latch ECL circuit formed of bipolar transistors 26 and 27, a mode switching ECL circuit formed of bipolar transistors 20 and 28, an emitter follower circuit formed of bipolar transistors 22 and 23, diodes 24 and 25, and constant current sources 29 and 30, and a current source switching circuit formed of N channel MOS transistors 115, 116, 117, 118, 119, and 122, P channel MOS transistors 120 and 121, and a CMOS inverter 123.

The current source switching circuit includes the CMOS inverter 123 for inverting the through signal THM at the MOS level, a transmission gate (MOS transistors 121, 122) for transmitting a third reference potential VCS2 to the gate of the MOS transistor 116 in response to the output of the inverter 123 and the through signal THM, a transmission gate (MOS transistors 119, 120) for transmitting the reference potential VCS2 to the gate of the MOS transistor 115 similarly in response to the through signal THM and the output of the inverter 123, the MOS transistor 118 for coupling the gate of the MOS transistor 115 to the second power source potential $V_{EE}$ 48 in response to the through signal THM, and the MOS transistor 117 for setting the gate potential of the MOS transistor 116 to the second power source potential 48 ($V_{EE}$) in response to the output of the inverter 123.

The NMOS transistor 115, in response to its gate potential, connects the collector of the bipolar transistor 20 to the second power source potential 48. The NMOS transistor 116, in response to its gate potential, connects the emitter potential of the transistor 20 in the input mode switching circuit to the second power source potential 48 ($V_{EE}$).

The input slave circuit 134 has similar circuit configuration to that of the input master circuit 113. It includes an input ECL circuit formed of bipolar transistors 33 and 34, a latch ECL circuit formed of bipolar transistors 41 and 42, a mode switching ECL circuit formed of bipolar transistors 35 and 43, an emitter follower circuit formed of bipolar transistors 37 and 38, diodes 39 and 40, and constant current source 44 and 45, and a current source switching circuit formed of NMOS transistors 124, 125, 126, 127, 128, and 131, PMOS transistors 129 and 130, and a CMOS inverter 132.

The PMOS transistor 130 and NMOS transistor 131 form a transmission gate, which transmits the reference potential VCS2 to the gate of the NMOS transistor 125 in response to the through signal THM and the output of the inverter 132. The NMOS transistor 125, in response to its gate potential, connects the emitter output of the mode switching ECL circuit to the second power source potential 48 ($V_{EE}$).

The NMOS transistor 128 and PMOS transistor 129 form a transmission gate, which transmits the reference potential VCS2 to the gate of the NMOS transistor 124 in response to the through signal THM and the output of the inverter 132. The NMOS transistor 124, in response to its gate potential, connects the collector of the bipolar transistor 35 to the second power source potential 48 ($V_{EE}$). The NMOS transistor 126 is turned on in response to the output of the inverter 132 and connects the gate of the transistor 125 to the second power source potential 48 ($V_{EE}$). The NMOS transistor 127 is turned on in response to the through signal THM and connects the gate of the NMOS transistor 124 to the second power source potential 48 ($V_{EE}$).

The reference potential VCS2 is a potential at a level causing the NMOS transistor to operate in the pentode region or the nonsaturation region, thereby setting the current flowing therethrough to a value corresponding to the gate potential. The through signal THM is a potential at a level causing the MOS transistor in the saturation region. The operation will be described below.

Referring to FIG. 16, when the through signal THM is at "H" ($V_{CC}$ level) of the MOS level, in the input master circuit 133, the output of the CMOS inverter 123 becomes "L" ($V_{EE}$ level) of the MOS level. Accordingly, the NMOS transistor 118 and the PMOS transistor 121 are turned on and the NMOS transistors 117 and 119 and the PMOS transistor 120 are turned off. The NMOS transistor 115 is turned off, with its gate connected to the second power source potential 48 ($V_{EE}$) through the NMOS transistor 118, while the transistor 116 for constant current source is turned on with the reference potential VCS2 supplied to its gate through the PMOS transistor 121 in the on state, and operates as the constant current source. Then, the latch state and the through state, the same as described in FIG. 5, are brought about by the mode switching ECL circuit (transistors 20, 28) in response to the clock signal, and thus, the semiconductor integrated circuit operates similarly to a STRAM.

When the through signal THM is at "L" of the MOS level, in the input master circuit 133, the output of the CMOS inverter 123 becomes "H", the NMOS transistors 118 and 122 and the PMOS transistor 121 are turned off and the NMOS transistors 117 and 119 and the PMOS transistor 120 are turned on. Hence, the transistor 116 for constant current source is turned off with its gate potential brought to the level of the second power source potential $V_{EE}$, while the transistor 115 for constant current source is turned on with its gate potential brought to the level of the reference potential VCS2. Since the transistor 116 serving as the constant current source for the mode switching ECL circuit is in the off state at this time, the input ECL circuit formed of the bipolar transistors 18 and 19 performs the switching operation corresponding to the input signal IN no matter whether the external clock signal CLK is at "H" or at "L". Therefore, the circuit is brought to the through state and its operating mode becomes the same as the standard RAM operating mode.

Also in the input slave circuit 134, when the through signal THM is at "H" of the MOS level, the output of the CMOS inverter 132 becomes "L", and the NMOS transistors 127 and 131 and the PMOS transistor 130 are turned on, while the NMOS transistor 126 and 128 and the PMOS transistor 129 are turned off. Accordingly, the transistor 124 for constant current source is turned off and the transistor 125 for constant current source is turned on with its gate potential brought to the level of the reference potential VCS2. In such state, the operating mode of the circuit becomes the same as that of the STRAM explained in FIG. 5 and, therefore, the semiconductor integrated circuit operates as a STRAM.

When the through signal THM is at "L", in the input slave circuit 134, the output of the CMOS inverter 132 becomes "H", and the NMOS transistors 127 and 131 and the PMOS transistor 130 are turned off, while the NMOS transistors 126 and 128 and the PMOS transistor 129 are turned on; the transistor 125 for constant current source is turned off, while the transistor 124 for constant current source is turned on with its gate potential bought to the level of the reference potential VCS2. Under such state, the transistor 125 for constant current source for the mode switching ECL circuit operating in response to the internal clock signals NCLKB and CLKB is in the off state, and therefore, the input ECL circuit formed of the bipolar transistors 33 and 34 performs a switching operation in response to the input signal by means of the transistor 124 for constant current source in the on state. Thus, the operating mode of the circuit becomes that of a standard RAM.

In summary, when the through signal THM is at "H", the input master circuit 133 is brought to the latch state and the input slave circuit 134 is brought to the through state during the period (A) shown in FIG. 4, whereas the input master circuit 133 is brought to the through state and the input slave circuit 134 is brought to the latch state during the period that the external clock signal CLK is at "L" (period (B) in FIG. 4). Thus, the semiconductor integrated circuit is brought to the operating mode in which it operates as a STRAM.

On the other hand, when the through signal THM is at "L", the input master circuit 133 and the input slave circuit 134 are brought to the through state regardless of the level of the external clock signal CLK and the semiconductor integrated circuit is brought to the operating mode in which it operates as a standard RAM.

Figure 17:
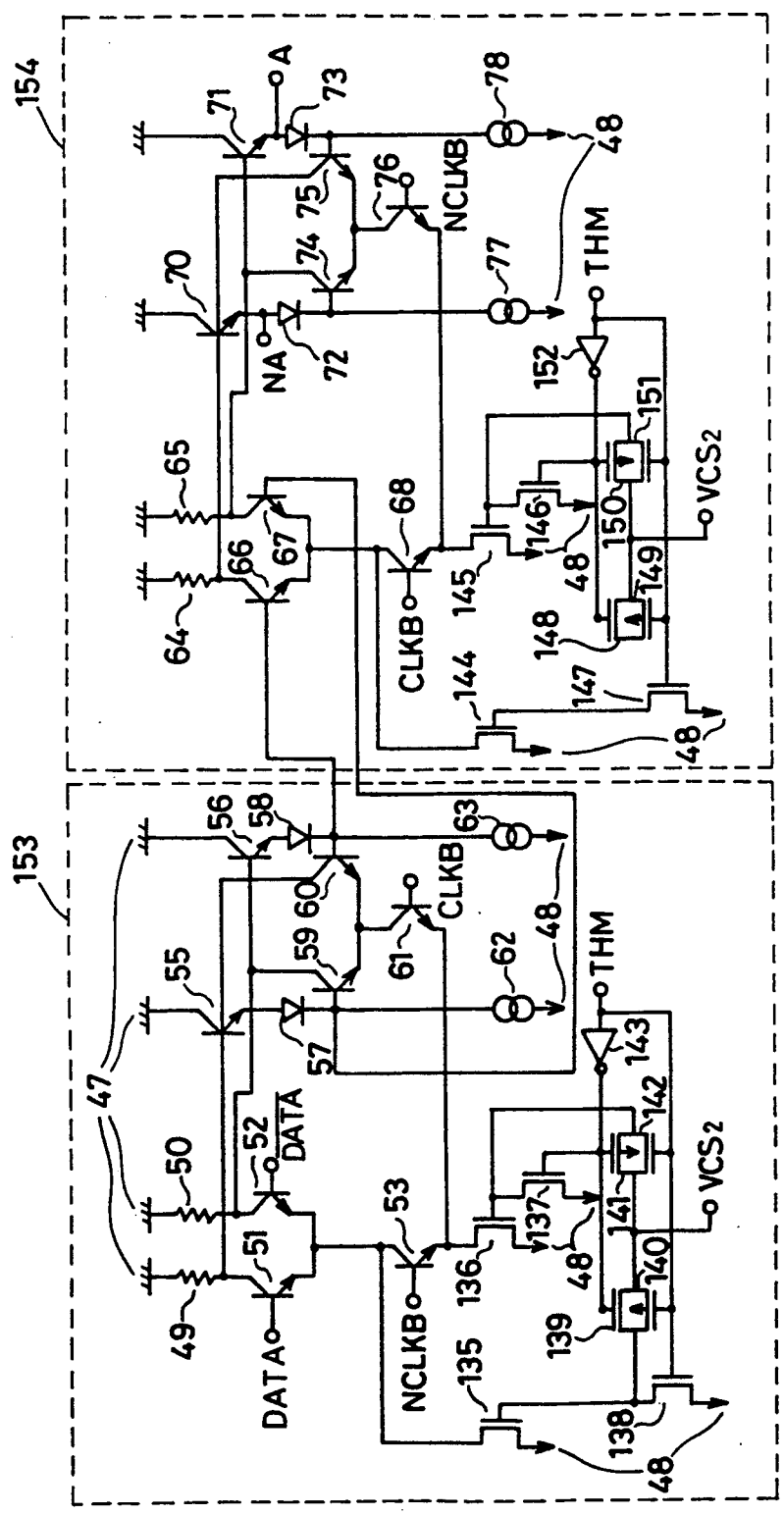
FIG. 17 is a diagram showing another example of structure of an output data retaining circuit according to the present invention.

FIG. 17 is a diagram showing another example of structure of an output data retaining circuit. The output data retaining circuit 11' has the same configuration as that of the input data retaining circuit shown in FIG. 16, only differing therefrom in that the signals supplied to the input ECL circuit of the output master circuit 153 are complementary data DATA and $\overline{DATA}$ from the sense amplifier. Since FIG. 17 is only different from FIG. 16 in the reference numerals given to the transistors, no particular explanation of the circuit configuration and constituents will be made.

The operation of the output data retaining circuit 11' shown in FIG. 15 is quite the same as that of the input data retaining circuit 8' shown in FIG. 14, that is, when the through signal THM is at "L" of the MOS level, the output master circuit 153 and the output slave circuit 154 are brought to the through state regardless of the level of the external clock signal CLK and the semiconductor integrated circuit is brought to the operating mode in which it operates as a standard RAM. On the other hand, when the through signal THM is at "H" of the MOS level, the output master circuit 153 is brought to the latch state and the output slave circuit 154 is brought to the through state during the period that the external clock signal CLK is at "H" of the MOS level, whereas the output master circuit 153 is brought to the through state and the output slave circuit 154 is brought to the latch state during the period that the external clock signal CLK is at "L", and thus, the semiconductor integrated circuit is brought to the operating mode in which it operates as a STRAM.

In this way, even if input and output data retaining circuits of such BiCMOS structure are used, it becomes possible to cause the semiconductor integrated circuit to operate both as a standard RAM and as a STRAM. Accordingly, when it is desired to carry out the check of the access time within the chip or verification of the operation of memory cells, the semiconductor integrated circuit may be operated as a standard RAM by bringing the level of the through signal THM to "L", and when it is desired to verify that the semiconductor integrated circuit is operating as a STRAM, it may be operated with the through signal THM set to "H".

Now, a method for generating the through signal THM will be described. The same as in the case of the ECL circuit configuration, two methods can be practiced in this case, i.e., one method in which the through signal THM is provided through the pad not connected with any used external pin of the package of the semiconductor integrated circuit and another method in which the through signal THM is generated within the chip by the control of the potential level at the reference potential pad or the control signal terminal $\overline{WE}$ or $\overline{CE}$ connected with the external pin of the package.

Figure 18:
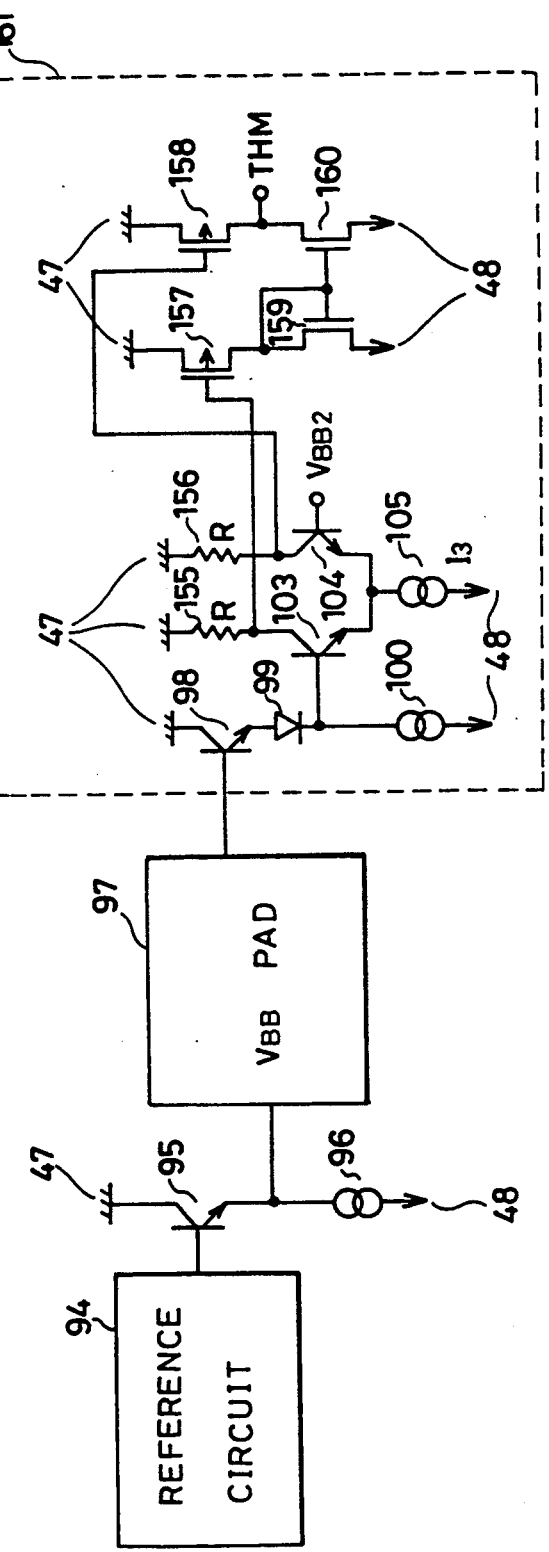
FIG. 18 is a diagram showing a circuit configuration for generating a through signal for the input and output data retaining circuits shown in FIG. 14 and FIG. 15.

FIG. 18 is a diagram showing a circuit configuration for generating the through signal THM within the chip by controlling the potential level at the reference potential pad 97 connected with an external pin. Referring to FIG. 18, the through signal generating circuit 161 includes an input emitter follower circuit receiving the potential of the $V_{BB}$ pad 97, a comparison ECL circuit for comparing the output of the emitter follower circuit with a reference potential $V_{BB2}$, and a THM generating circuit for generating the through signal THM according to the output of the comparing ECL circuit.

The input emitter follower circuit includes an npn bipolar transistor 98 receiving the $V_{BB}$ pad potential at its base, a level shifting diode 99 for level-shifting and outputting the emitter potential of the bipolar transistor 98, and a constant current source 100.

The comparison ECL circuit includes emitter-coupled bipolar transistors 103 and 104 for comparing the cathode potential of the level shifting diode 99 with the second reference potential $V_{BB2}$, a second constant current source 105 connected with the emitters in common of the bipolar transistors 103 and 104, and resistors 155 and 156 respectively connecting the collectors of the bipolar transistor 103 and 104 with the first power source potential 47 (Vcc).

The THM generating circuit includes a PMOS transistor 157 receiving the collector potential of the bipolar transistor 103 at its gate, a PMOS transistor 158 receiving the collector potential of the bipolar transistor 104 at its gate, and NMOS transistors 159 and 160 forming a current mirror circuit. The gate and the drain of the NMOS transistor 159 are interconnected. The through signal THM is generated from the junction point of the PMOS transistor 158 and NMOS transistor 160.

Similarly as in the case of FIG. 12, a reference potential from the reference circuit 94 is provided to the $V_{BB}$ pad 97 through the emitter follower transistor 95. The operation will be described below.

The reference potential generated by the reference circuit 94 is level-shifted by the emitter follower circuit formed of the bipolar transistor 95 and the constant current source 96 and then output to the $V_{BB}$ pad 97. The reference potential output to the $V_{BB}$ pad 97 is normally $-1.3$ V. The reference potential at $-1.3$ V transmitted to the $V_{BB}$ pad 97 is level-shifted by $2 \cdot V_{BE}$ through the bipolar transistor 98 and the diode 99 and transmitted to the base of the bipolar transistor 103. The second power source potential $V_{BB2}$ is set to about $-2.1$ V. In this case, the base potential of the bipolar transistor 103 is level-shifted by $2 \cdot V_{BE}$ from $-1.3$ V and becomes about $-2.9$ V. Hence, the bipolar transistor 104 is turned on and a current I3 flows through the resistor 156, the bipolar transistor 104, and the constant current source 105. As a result, the gate potential of the PMOS transistor 158 becomes $V_{CC} - I3 \cdot R$ and the PMOS transistor 158 is turned on, while the PMOS transistor 157 is turned off. The PMOS transistors 157, 158, 159, and 160 form a current mirror circuit and currents of the same amount flow through the MOS transistors 160 and 159. At this time, a minimum of current flows through the MOS transistor 160 and the through signal TH is charged through the PMOS transistor 158 and goes to "H" of the MOS level. Therefore, in the normal mode in which the voltage is received from the $V_{BB}$ pad 97, the semiconductor integrated circuit is brought to the mode in which it operates as a STRAM.

When the semiconductor integrated circuit is to be operated as a standard RAM for measuring the access time, a relatively higher voltage, $V_{CC}$, for example, is externally applied to the $V_{BB}$ pad 97. Then, the base potential of the bipolar transistor 103 becomes $V_{CC} - 2 \cdot V_{BE}$, namely, about $-1.6$ V. Therefore, the bipolar transistor 103 is turned on and the bipolar transistor 104 is turned off, so that the current I3 flows through the resistor 155, the bipolar transistor 103, and the constant current source 105, and thereby, the PMOS transistor 157 is turned on and the PMOS transistor 158 is turned off. Consequently, the through signal THM is discharged through the transistor 160 and goes to "L" of the MOS level. Thus, when the potential $V_{CC}$ is applied to the $V_{BB}$ pad 97, the through signal THM goes to "L" and, by means of the circuit arrangements shown in FIG. 16 and FIG. 17, the semiconductor integrated circuit is brought to the same operating mode as that of a standard RAM.

When the potential $V_{CC}$ is applied to the $V_{BB}$ pad, the emitter potential of the bipolar transistor 95 becomes $V_{CC}$ and, hence, the bipolar transistor 95 is brought to a cutoff state the same as in the circuit configuration shown in FIG. 12, so that the application of the potential $V_{CC}$ to the $V_{BB}$ pad 97 is prevented from affecting the internal reference circuit 94.

Figure 19:
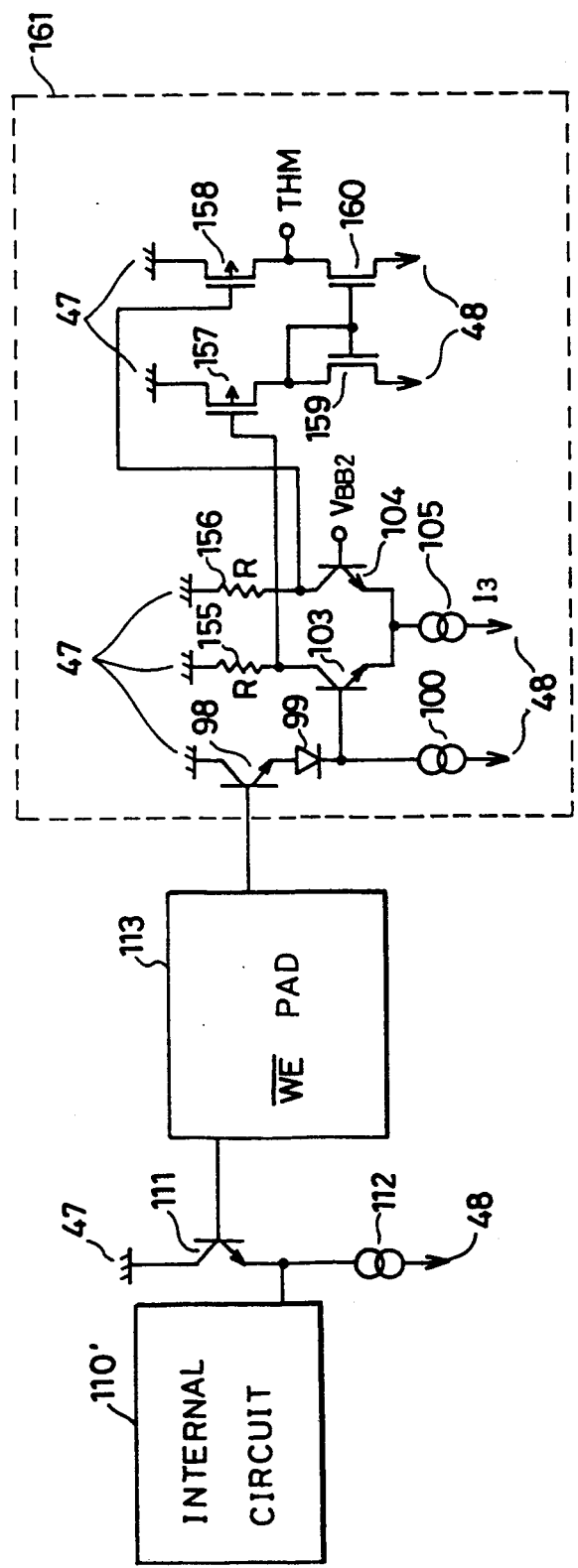
FIG. 19 is a diagram showing a structure of a second embodiment for generating a through signal of the MOS level.

FIG. 19 is a diagram showing another circuit arrangement for generating the through signal THM. In FIG. 17, the same circuit configuration as that of the through signal generating circuit shown in FIG. 18 is used, but the through signal generating circuit 161 operates in response to the potential at the $\overline{WE}$ pad 133 which is supplied with the write-enable signal $\overline{WE}$. The structure and operation of the through signal generating circuit 161 shown in FIG. 17 are quite the same as the through signal generating circuit shown in FIG. 18. The operation will be briefly described below.

Normally, the pad 113 is supplied with inputs at the ECL level, that is, $-0.9$ V at "H" and $-1.7$ V at "L". Hence, the base potential of the bipolar transistor 103 has a level shifted by $2 \cdot V_{BB}$ from $-0.9$ V or $-1.7$ V, that is, about $-2.5$ V or $-3.3$ V, while the reference potential $V_{BB2}$ is $-2.1$ V. Hence, the bipolar transistor 104 is turned on no matter whether the write-enable signal $\overline{WE}$ is at "H" or at "L", and a current I3 flows through the resistor 156, the bipolar transistor 104, and the constant current source 105. Accordingly, in this case, the PMOS transistor 158 is turned on and the through signal THM goes to "H" of the MOS level.

In this case, the semiconductor integrated circuit is brought to the mode in which it operates as a STRAM. To bring the circuit to the mode in which it is operated as a standard RAM, a relatively higher potential, the potential $V_{CC}$, for example, is externally applied to the pad 113. Then, the base potential of the bipolar transistor 103 becomes $V_{CC} - 2 \cdot V_{BE}$, i.e., about $-1.6$ V. Accordingly, the bipolar transistor 103 is turned on and the bipolar transistor 104 is turned off, and the current I3 flows through the resistor 155, the bipolar transistor 103, and the constant current source 105. Hence, the PMOS transistor 157 is turned on, the PMOS transistor 158 is turned off, and the NMOS transistor 160 is turned on. Accordingly, the potential of the through signal THM becomes "L" of the MOS level. Thus, by applying the potential $V_{CC}$ to the pad 113, the through signal THM is brought to "L" and the semiconductor integrated circuit is brought to the mode in which is operates as a standard RAM.

The effect of the application of the potential $V_{CC}$ to the pad 113 on the internal circuit 110 at the time of data reading is only the level shift of the emitter potential of the bipolar transistor 11 from $-1.7$ V to $-0.8$ V, and this produces no problem if circuit parameters (for example, the reference potential) of the internal circuit 110' are set to most suitable values.

Figure 20:
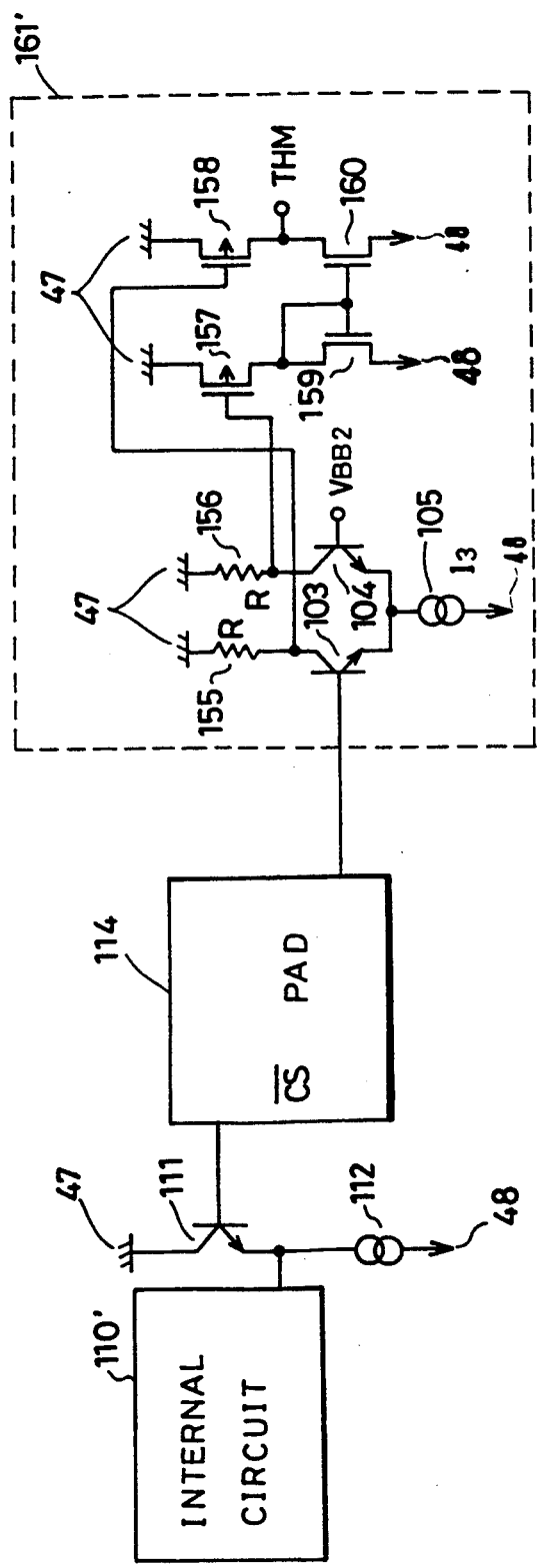
FIG. 20 is a diagram showing a structure of a third embodiment for generating a through signal of the MOS level.

An example of circuit configuration of another through signal generating circuit is shown in FIG. 20. The through signal generating circuit 161' shown in FIG. 20 is adapted to generate the through signal in response to the potential at the pad 114 receiving the chip-select signal $\overline{CS}$. Referring to FIG. 20, the through signal generating circuit 161, has the same configuration as the through signal generating circuit 161 shown in FIG. 18, except that there is not provided the emitter follower circuit for input level shifting and the input to the CMOS current mirror circuit is arranged in the opposite way to that in the through signal generating circuit 161. More specifically, the bipolar transistor 103 receives the potential of the $\overline{CS}$ pad 114 at its base and transmits its collector potential to the gate of the PMOS transistor 158. The bipolar transistor 104 receives the second reference potential $V_{BB2}$ at its base and transmits its collector potential to the gate of the PMOS transistor 157. Since the transmission path from the $\overline{CS}$ pad 114 to the internal circuit 110' is arranged the same as that shown in FIG. 15, detailed explanation of it will be omitted.

The operation will be briefly described below. The chip-select signal $\overline{CS}$ supplied to the pad 114 is normally at the ECL level and its "H" is $-0.9$ V and "L" is $-1.7$ V. Accordingly, in the normal operation the bipolar transistor 103 is held on with the reference potential $V_{BB2}$ held at $-2.1$ V, and a current I3 flows through the resistor 155, the bipolar transistor 103, and the constant current source 105. Hence, the PMOS transistor 158 is turned on and the through signal THM goes to "H" of the MOS level. Therefore, the semiconductor integrated circuit is brought to the mode in which it operates as a STRAM.

When it is required to measure an access time in the semiconductor integrated circuit, the through signal THM must be brought to "L". In such case, a potential at a relatively lower level, the second power source potential $V_{EE}$, for example, is externally applied to the pad 114. Then, the base potential of the bipolar transistor 103 is brought to $V_{EE}$. Hence, the bipolar transistor 103 is turned off and the bipolar transistor 104 is turned on. Accordingly, the current I3 flows through the resistor 156, the bipolar transistor 104, and the constant current source 105, so that the PMOS transistor 157 and the NMOS transistor 160 are turned on and the PMOS transistor 158 is turned off. As a result, the through signal THM is brought to "L" of the MOS level. In this way, the semiconductor integrated circuit is put into the mode in which it operates as a standard RAM.

The effect on the internal circuit 110' of the application of the potential $V_{EE}$ to the pad 114 is the same as explained with reference to FIG. 15, that is, no bad effect is produced on the internal circuit 110' because the bipolar transistor 111 is in a cut off state.

Although in the through signal generating circuits 161 and 161' of FIG. 18, FIG. 19, and FIG. 20, the level converting circuit from the ECL level to the MOS level is formed of a CMOS current mirror circuit, the level converting circuit is not limited to such circuit but may be of other type provided that it can convert the ECL level to the MOS level.

In the foregoing description of the embodiments, the semiconductor integrated circuits have been of the register type STRAM. However, the same effects as obtained in such embodiments can be obtained even if the circuit is formed of a latch type STRAM whose input portion has input and output data retaining circuits formed, for example, of D type flip-flop or one stage of D latch, in which signals are latched and output by being triggered by an edge of a clock signal.

In the foregoing description of the embodiments, the ECL RAM has been used as an example of the standard RAM included in the semiconductor integrated circuit. However, the memory circuit portion is not limited to such type but the same effects as obtained in the described embodiments can be obtained even if it is a memory of a BiCMOS structure, a bipolar RAM of the TTL level, or the like, provided that it includes a level converting circuit. More specifically, when the memory is formed of a BiCMOS circuit and the memory cells are formed of MOS transistors, the same effects as obtained in the above described embodiments can be obtained if there is provided a level converting circuit converting the ECL level to the MOS level.

In the foregoing description of the embodiments, the case where the semiconductor integrated circuit has a semiconductor memory device as its internal functional circuit has been mentioned as an example. However, the internal functional circuit is not limited to such semiconductor memory device but similar effects to those obtained in the described embodiments can be obtained even if it is, for example, a general logic circuit performing desired logical operations.

In the foregoing description of the embodiments, special emphasis has been given to the ease of failure analysis in the test of the semiconductor integrated circuit performed by switching its operating modes between the STRAM mode and the standard RAM mode. However, in that case, it is also possible to cause the semiconductor integrated circuit to operate both as a STRAM and as a standard RAM by the use of the through signal TH or THM. Therefore, it is not necessary to use the through signal specifically as the signal for switching test modes, but it is possible to use the signal as a control signal specifying the functional operation of the semiconductor integrated circuit. Then, it becomes possible to obtain a semiconductor integrated circuit of the same chip arrangement performing two functions only by the provisions of the control signal. More specifically, by using the through signal as the function control signal, a semiconductor integrated circuit of the same chip arrangement can be used both as a synchronous semiconductor integrated circuit and as a so-called asynchronous (performing operations not in step with an external clock) semiconductor integrated circuit.

According to the present invention as described in the foregoing, a semiconductor integrated circuit is provided which comprises an input data retaining circuit latching and outputting input signals in response to a clock signal, an internal function circuit performing a predetermined function in response to the output of the input data retaining circuit, an output data retaining circuit for latching and outputting the output of the internal functional circuit in response to the clock signal, and a function setting circuit for disabling the latch function of the input and output data retaining circuits, thereby setting the circuits in the through state, in response to a functional mode specifying signal, and therefore, it becomes possible to allow the same semiconductor integrated circuit to perform both synchronous operation and asynchronous operation.

When the internal functional circuit is a RAM, it becomes possible to allow the semiconductor integrated circuit to operate both as a standard RAM and as a STRAM according to the functional mode specifying signal.

Further, by causing such semiconductor integrated circuit to operate as a standard RAM or a STRAM by means of the functional mode switching signal, failure analysis of the semiconductor integrated circuit becomes simpler and access time or the like can be easily measured without changing the cycle time.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit selectively operable either in a synchronous operation mode and an asynchronous operation mode, comprising:

clock signal generating means (9) for generating a clock signal;

internal input signal generating means (8) responsive to the clock signal for latching and outputting an externally supplied input signal, thereby generating an internal input signal;

internal functional circuit means (7) responsive to the internal input signal from said internal input signal generating means for performing a predetermined function;

output circuit means (11) responsive to the clock signal for latching an output signal from said internal functional circuit means and outputting a first output signal; and setting means (81, 82, 85, 86; 124–132, 114–123; 144–152, 135–143) responsive to a signal specifying an operation mode for disabling the latch function of said internal input signal generating means and said output circuit means, thereby setting said internal input signal generating means and said output circuit means in a through state where any signals supplied thereto pass therethrough.

2. A semiconductor integrated circuit according to claim 1, wherein said clock signal generating means includes means (9) for generating first and second internal clock signals complementary to each other, said internal input signal generating means includes first CML circuit means (18, 19, 20, 33, 34, 35) operating in the current mode, activated in response to the first internal clock signal for switching current paths thereof in accordance with an externally supplied input signal, thereby generating an internal input signal, and latch means (26, 27, 28, 41, 42, 43) activated in response to the second internal clock signal for latching the internal input signal, said latch means including second CML circuit means operating in accordance with the internal input signal, and said setting means include means (81, 82, 86; 115, 120–123, 124, 127–132) responsive to the second operation mode specifying signal for activating only said fist CML circuits while ignoring the first and second internal clock signals.

3. A semiconductor integrated circuit according to claim 1, wherein said clock signal generating means includes means (9) for generating first and second internal clock signals complementary to each other, said output circuit means includes first CML circuit means (51, 52, 53, 66, 67, 68) operating in the current mode, activated in response to the first internal clock signal for switching current paths thereof in accordance with an output signal from said internal functional circuit means, thereby outputting the first output signal, and latch means (59, 60, 61, 74, 75, 76) for latching the first output signal in response to said second internal clock signal, and said setting means include means (85, 86; 135–143, 144–152) responsive to the second operation mode specifying signal for activating only said first CML circuits while ignoring the first and second internal clock signals.

4. A semiconductor integrated circuit according to claim 1, further comprising:

a first pad (91) for receiving an externally supplied operating power voltage; and a second pad (90) in connection with said first pad, wherein the second operation mode specifying signal is generated in response to the signal potential supplied to said second pad.

5. A semiconductor integrated circuit according to claim 1, further comprising:

a pad (113) for receiving an externally supplied signal setting an operation mode of said internal functional circuit means; and means (109; 113) responsive to the signal potential on said pad for generating the second operation mode specifying signal.

6. A semiconductor integrated circuit according to claim 1, further comprising:

a pad (114) for receiving a externally supplied signal enabling said internal function circuit means; and means (109'; 161') responsive to the signal potential on said pad for generating the second operation mode specifying signal.

7. A semiconductor integrated circuit according to claim 1, further comprising:

means (94) for generating a reference potential;

a pad (97) for outputting externally the reference potential; and means (109; 161) responsive to the signal potential on said pad for generating the second operation mode specifying signal.

8. A semiconductor integrated circuit according to claim 1, wherein said internal functional circuit means is a randomly accessible semiconductor memory device.

9. A semiconductor integrated circuit comprising:

means (9) responsive to an externally supplied clock signal for generating an internal clock signal;

means (8') responsive to the internal clock signal for latching an externally supplied input signal and generating an internal input signal, said internal input signal generating means including first CML circuitry (18, 19, 33, 34) operating in the current mode, for switching current paths thereof in accordance with the input signal, thereby generating the internal input signal, first constant current supply means (20, 35) responsive to the internal clock signal for supplying a constant current to said first CML circuit, second CML circuitry (26, 27, 41, 42) operating in the current mode, responsive to the internal input signal for switching current paths thereof, thereby latching the internal input signal, and second constant current supply means (28, 43) responsive to the internal clock signal for supplying a constant current to said second CML circuit, said first and second constant current supply means operating complementary to each other and being supplied with the current from a first constant current source (21, 36);

internal functional circuit means (7) responsive to the internal input signal for performing a predetermined functional operation;

output circuit means (11), activated in response to the internal clock signal for receiving an output from said internal functional circuit, thereby generating a first output signal, said output circuit means including third CML circuits (51, 52, 66, 67) operating in the current mode, for switching current paths thereof in accordance with the output from said internal functional circuit means, thereby generating the first output signal, third constant current supply means (53, 68) responsive to the internal clock signal for supplying a constant current to said third CML circuit, fourth CML circuits (59, 60, 74, 75) operating in the current mode, for switching current paths thereof in accordance with the first output signal, and for latching the first output signal, and fourth constant current supply means (61, 76) responsive to the internal clock signal for supplying a constant current to said fourth CML circuit, said third and fourth constant current supply means operating complementary to each other and being supplied with the constant current from a second constant current source;

means (91; 97, 109; 109, 113; 109,, 114, 97, 161; 113, 161; 114, 161,) responsive to an external control signal for generating an operation mode specifying signal; and fifth constant current supply means (85, 86, 81, 82; 115-123, 124-132) responsive to the operation mode specifying signal for supplying constant currents from said first and second constant current sources only to said first and third CML circuits, respectively, while ignoring the internal clock signals.

10. A semiconductor integrated circuit according to claim 9, wherein said first and second CML circuits each comprises a pair of emitter-coupled bipolar transistors, said first constant current supply means comprises a first bipolar transistor (20, 35) having the collector coupled with the emitters in common of said first CML circuit, the emitter connected with said first constant current source, and the base supplied with the internal clock signal, said second constant current supply means comprises a second bipolar transistor (28, 43) having the collector coupled with the emitters in common of said second CML circuit, the emitter connected with said first constant current source, and the base supplied with the internal clock signal, said first and second bipolar transistors being supplied with the internal clock signals at the base so as to operate complementally to each other, and said fifth constant current supply means comprises third bipolar transistor (81, 82) having the emitter connected with said first constant current source, the co lector coupled with the emitters in common of said first CML circuit, and the base receiving the operation mode specifying signal.

11. A semiconductor integrated circuit according to claim 9, wherein said third and fourth CML circuitry each comprise a pair of emitter-coupled bipolar transistors, said third constant current supply means comprises a first bipolar transistor (53, 68) having the collector coupled with the emitters in common of said third CML circuit, the emitter connected with said second constant current source, and the base supplied with the internal clock signal, said fourth constant current supply means comprises a second bipolar transistor (61, 76) having the collector coupled with the emitters in common of said fourth CML circuit, the emitter connected with said second constant current source, and the base supplied with the internal clock signal, said first and second bipolar transistors being supplied with the internal clock signals at their bases so as to operate complementally to each other, and said fifth constant current supply means comprises a third bipolar transistor (85, 86) having the emitter connected with said second constant current source, the collector coupled with the emitter in common of said third CML circuit, and the base supplied with the signal specifying operational mode.

12. A semiconductor integrated circuit according to claim 9, further comprising:

a first pad (91) for receiving an externally supplied operating power voltage; and a second pad (90) in connection with said first pad, wherein the operation mode specifying signal is generated in response to the signal potential supplied to said second pad.

13. A semiconductor integrated circuit according to claim 9, further comprising:

a pad (113) for receiving an externally supplied signal for setting an operation mode for said internal functional circuit means; and circuit means (103; 104) operating in the current mode, responsive to the signal potential on said pad for switching current paths thereof, thereby generating the operation mode specifying signal.

14. A semiconductor integrated circuit according to claim 9, further comprising:

circuit means (94) for generating a reference potential;

a pad (97) for outputting externally the reference potential; and circuit means (102, 103) operating in the current mode, responsive to the signal potential on said pad for switching current paths thereof, thereby generating the operation mode specifying signal.

15. A semiconductor integrated circuit according to claim 9, further comprising:

a pad (114) for receiving a externally supplied signal enabling said internal functional circuit means; and circuit means (102, 103; 109') operating in the current mode, responsive to the signal potential on said pad for switching current paths thereof, thereby generating the operation mode specifying signal.

16. A semiconductor integrated circuit according to claim 9, wherein said first and second CML circuits each comprises a pair of emitter-coupled bipolar transistors (18/19, 26/27), said first constant current supply means comprises a first bipolar transistor (20, 35) having the collector coupled with the emitters in common of said first CML circuit, the emitter connected with said first constant current source, and the base supplied with the internal clock signal, said second constant current supply means comprises a second bipolar transistor (28, 43) having the collector coupled with the emitters in common of said second CML circuit, the emitter connected with said first constant current source, and the base supplied with the internal clock signal, the first and the second bipolar transistors operating complementally to each other, said first constant current source comprises a first insulated-gate field-effect transistor (116, 125) having one conduction terminal connected with said first and second bipolar transistors, the other conduction terminal connected with a first operating power source, and the gate supplied with either of a control voltage and the first operating power source voltage, and said fifth constant current supply means comprises a second insulated-gate field-effect transistor (115, 124) having one conduction terminal coupled with the emitters in common of said first CML circuit, the other conduction terminal thereof connected with said first operating power source, and the gate supplied with either of the control voltage and the first operating power source voltage, and control means (117–123, 126–132) responsive to the operation mode specifying signal for supplying the gates of said first and second insulated-gate field-effect transistors with the first operating power source voltage and the control voltage, respectively, the control voltage allowing said insulated-gate field-effect transistor to operate in a pentode region.

17. A semiconductor integrated circuit according to claim 9, wherein said third and fourth CML circuits each comprises a pair of emitter-coupled bipolar transistors (51/52, 66/67), said second constant current supply means comprises a first bipolar transistor (53, 68) having the collector coupled with the emitters in common of said third CML circuit, the emitter connected with said first constant current source, and the base supplied with the internal clock signal, said second constant current supply means comprises a second bipolar transistor (61, 76) having the collector coupled with the emitters in common of said fourth CML circuit, the emitter connected with said second constant current source, and the base supplied with the internal clock signal, the first and the second bipolar transistors operating complementally to each other, said second constant current source comprises a first insulated-gate field-effect transistor (136, 145) having one conduction terminal connected with said first and second bipolar transistors, the other conduction terminal connected with a first operating power source, and the gate supplied with either of a control voltage and the first operating power source voltage, and said fifth constant current supply means comprises a second insulated-gate field-effect transistor (135, 144) having one conduction terminal coupled with the emitters in common of said first CML circuit, the other conduction terminal connected with said first operating power source, and the gate supplied with either the control voltage and the first operating power source voltage, and control means (137–143, 146–152) responsive to the operation mode specifying signal for supplying the gates of said first and second insulated-gate field effect transistors with the first operating power source voltage and the control voltage, respectively, the control voltage allowing said insulated-gate field-effect transistor to operate in a pentode region.

18. A semiconductor integrated circuit according to claim 16, wherein said control means includes insulated-gate field-effect transistors, and said integrated circuit further comprises circuit means (103, 104, 155, 156) operating in the current mode, responsive to an externally supplied control signal for switching current paths thereof, thereby providing a second control signal corresponding to the supplied control signal, and means (157–160) for converting the level of the second control signal to the level sufficient to drive said insulated-gate field-effect transistor and supplying the signal to said control means as the operation mode specifying signal.

19. A semiconductor integrated circuit according to claim 9, wherein said internal functional circuit means is a randomly accessible alterable semiconductor memory device.

20. A semiconductor integrated circuit according to claim 17, wherein said control means includes insulated-gate field-effect transistors, and said integrated circuit further comprises circuit means (103, 104, 155, 156) operating in the current mode, responsive to an externally supplied control signal for switching current paths thereof, thereby providing a second control signal corresponding to the supplied control signal, and means (157–160) for converting the level of the second control signal to the level sufficient to drive said insulated-gate field-effect transistor and supplying the signal to said control means as the operation mode specifying signal.

21. A method for operating a semiconductor integrated circuit, said semiconductor integrated circuit including a randomly accessible memory device (7), an input circuit (8') responsive to an externally supplied input signal for generating an internal input signal and supplying the internal input signal to said memory device, and an output circuit (11') for producing output data from data output from said memory device, comprising the steps of:

operating, in response to an externally supplied clock signal and a first level of an externally supplied control signal, said input circuit and said output circuit in synchronization with said clock signal; and operating, in response to a second level of the externally supplied control signal, both said input circuit and said output circuit to allow signals supplied thereto to pass therethrough.

22. A semiconductor integrated circuit including a functional circuit (7, 10) operable in synchronous and asynchronous modes, comprising:

an internal clock signal generating means (9) for generating internal clock signals in response to externally applied clock signals;

input and output latch circuits (8', 11') responsive to said internal clock signal for enabling latching and throughputting of input and output signals applied to and provided by said functional circuit in a synchronous mode of operation; and asynchronous operation mode control means (950, 92; 109; 109'; 161, 161') for selectively disabling latching by said input and output latch circuit of said input and output signals.

23. A method of testing a semiconductor integrated circuit including a functional circuit (7) operable in synchronous and asynchronous modes and comprising an internal clock signal generating means (9) for generating internal clock signals in response to externally applied clock signals, input and output latch circuits (8', 11') responsive to said internal clock signal for enabling latching and throughputting of input and output signals applied to and provided by said functional circuit in a synchronous mode of operation; and asynchronous operation mode control means (1950; 92; 109; 109'; 161; 161'; 81, 82, 85, 86; 115, 124, 144) for selectively disabling latching by said input and output latch circuits of said input and output signals, said method comprising the steps of:

while operating said integrated circuit in said synchronous mode of operation, supplying test data to and reading test data from said integrated circuit to obtain first test data;

while operating said integrated circuit in said asynchronous mode of operation, supplying test data to and reading test data from said integrated circuit to obtain second test data; and detecting which one of (1) said functional circuit and (2) said input and output latch circuits contains a malfunction by comparing said first and second test data.

24. A semiconductor integrated circuit selectively operable either in a synchronous mode and an asynchronous mode, comprising:

interface circuit means (8') responsive to an operation mode designating signal indicating one of the synchronous mode and the asynchronous, for transmitting a received input signal after once latching the received signal to an internal circuit provided in the semiconductor integrated circuit, when the operation mode designating signal indicates the synchronous mode, and for transmitting the received signal immediately without latching thereof to the internal circuit when the operation mode designating signal indicates the asynchronous mode.

* * * * *